United States Patent
Sooriakumar et al.

(10) Patent No.: US 10,508,024 B2
(45) Date of Patent: *Dec. 17, 2019

(54) DIRECTIONAL MICROPHONE AND ASSOCIATED PACKING TECHNIQUES

(71) Applicants: Kathirgamasundaram Sooriakumar, Rochester, NY (US); Anu Austin, Lengkong Tiga (SG); Ian Rose Bihag, Cebu (PH)

(72) Inventors: Kathirgamasundaram Sooriakumar, Rochester, NY (US); Anu Austin, Lengkong Tiga (SG); Ian Rose Bihag, Cebu (PH)

( * ) Notice: Subject to any disclaimer, the term of this patent is extended or adjusted under 35 U.S.C. 154(b) by 0 days.

This patent is subject to a terminal disclaimer.

(21) Appl. No.: 16/109,133

(22) Filed: Aug. 22, 2018

(65) Prior Publication Data

US 2019/0055119 A1 Feb. 21, 2019

Related U.S. Application Data

(63) Continuation of application No. 15/354,682, filed on Nov. 17, 2016, now Pat. No. 10,081,537.

(Continued)

(51) Int. Cl.
*H04R 19/04* (2006.01)
*B81B 7/00* (2006.01)
(Continued)

(52) U.S. Cl.
CPC .......... *B81B 7/0061* (2013.01); *B81B 7/0038* (2013.01); *H04R 1/04* (2013.01);
(Continued)

(58) Field of Classification Search
CPC ... H04R 1/02; H04R 1/04; H04R 1/38; H04R 1/406; H04R 19/005; H04R 19/04;
(Continued)

(56) References Cited

U.S. PATENT DOCUMENTS 3,963,881 A 6/1976 Fraim
4,281,222 A 7/1981 Nakagawa
(Continued)

*Primary Examiner* — Huyen D Le
(74) *Attorney, Agent, or Firm* — Cozen O'Connor

(57) ABSTRACT

Aspect of the disclosure provide a packaging technique for making a directional microphone which employs mechanical structures to cancel undesired background noise to realize the directional function instead of an extra sensor required in electronic noise-cancelling techniques, thus reducing footprint and cost of a directional microphone. A directional microphone based on this technique can include an acoustic sensor and a housing enclosing the acoustic sensor. The acoustic sensor can include a sensing diaphragm, a cavity below the sensing diaphragm, and a first substrate. The directional microphone device can further include a channel with an inlet open at an edge of the first substrate and an outlet connected with the cavity. The housing can include a cover attached to a second substrate supporting the first substrate. The cover can include a first opening over the sensing diaphragm and a second opening at a side of the cover.

19 Claims, 20 Drawing Sheets

Related U.S. Application Data

(60) Provisional application No. 62/397,186, filed on Sep. 20, 2016, provisional application No. 62/257,092, filed on Nov. 18, 2015.

(51) Int. Cl.
| | | |
|---|---|---|
| *H04R 1/44* | (2006.01) | |
| *H04R 1/04* | (2006.01) | |
| *H04R 1/28* | (2006.01) | |
| *H04R 17/02* | (2006.01) | |
| *H04R 19/00* | (2006.01) | |

(52) U.S. Cl.
CPC ............. *H04R 1/2876* (2013.01); *H04R 1/44* (2013.01); *H04R 17/02* (2013.01); *H04R 19/04* (2013.01); *B81B 2201/0257* (2013.01); *B81B 2201/0264* (2013.01); *B81B 2207/99* (2013.01); *H04R 19/005* (2013.01); *H04R 2201/003* (2013.01)

(58) Field of Classification Search
CPC .......... H04R 2201/003; H04R 2499/11; B81B 2201/0264
USPC ......... 381/91, 355, 356, 357, 358, 361, 369, 381/174, 175, 191; 438/51
See application file for complete search history.

(56) References Cited

U.S. PATENT DOCUMENTS

| | | | |
|---|---|---|---|
| 7,466,834 B2 | 12/2008 | Ogura | |
| 8,824,719 B2 | 9/2014 | Tanaka | |
| 9,736,596 B2* | 8/2017 | Kim | H04R 1/406 |
| 10,081,537 B2* | 9/2018 | Sooriakumar | B81B 7/0061 |
| 2014/0233756 A1* | 8/2014 | Inoda | H04R 1/38 |
| | | | 381/91 |

* cited by examiner

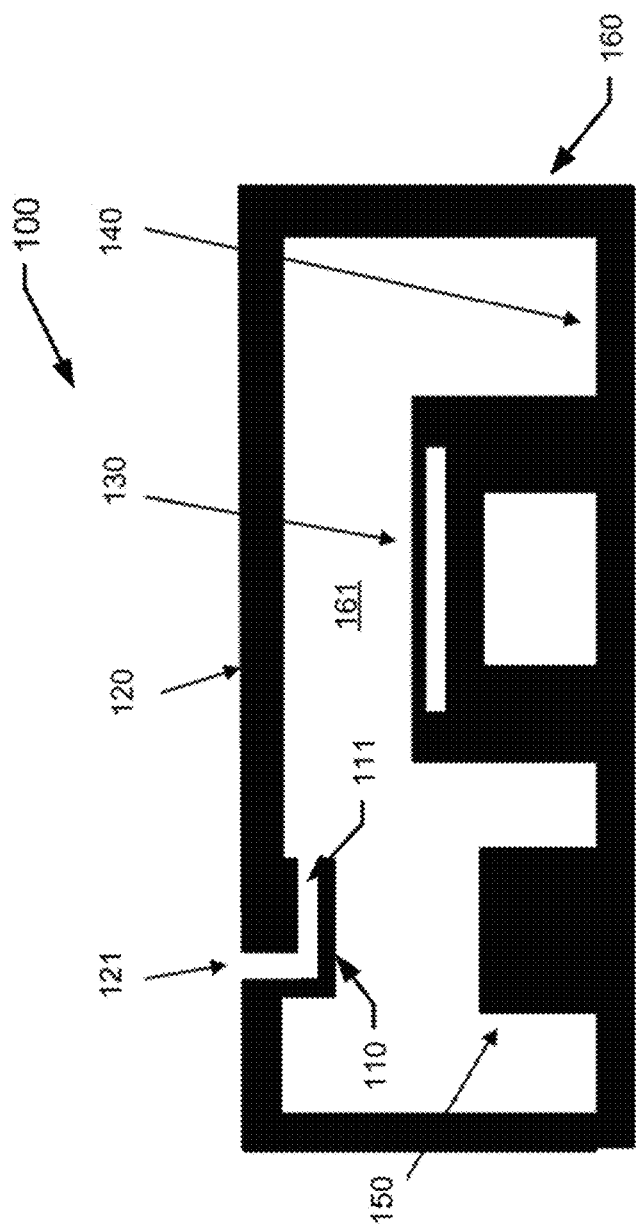

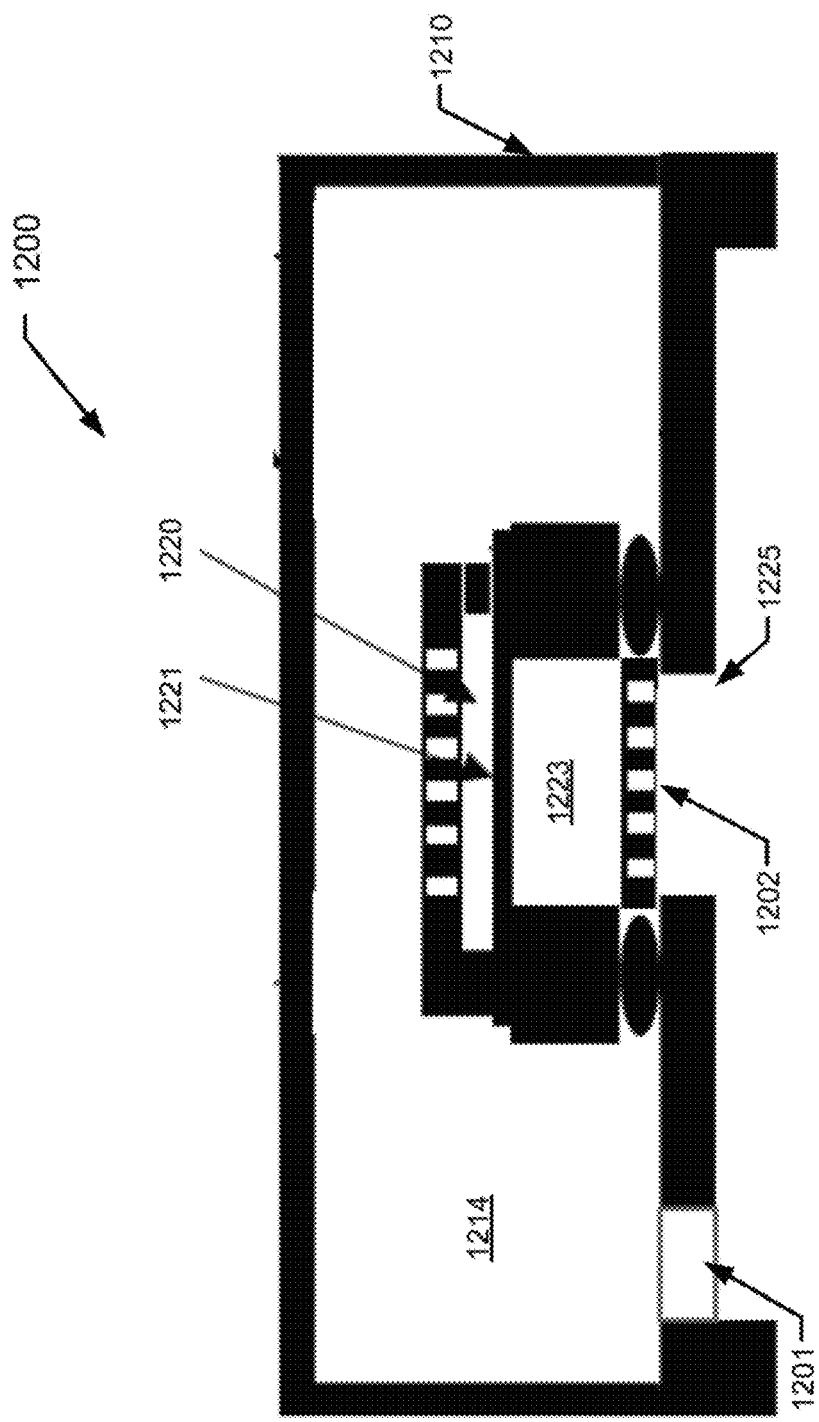

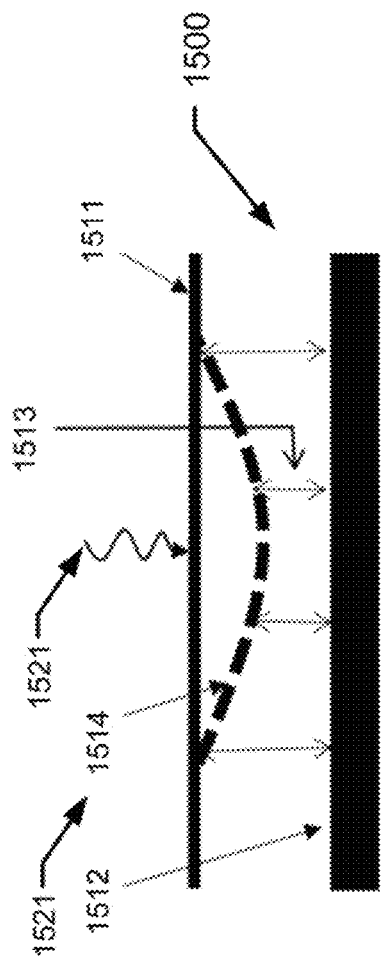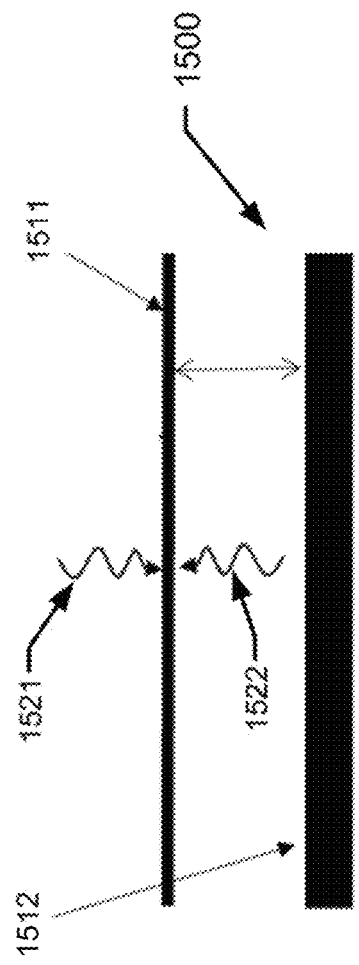
Fig. 15A
Fig. 15B

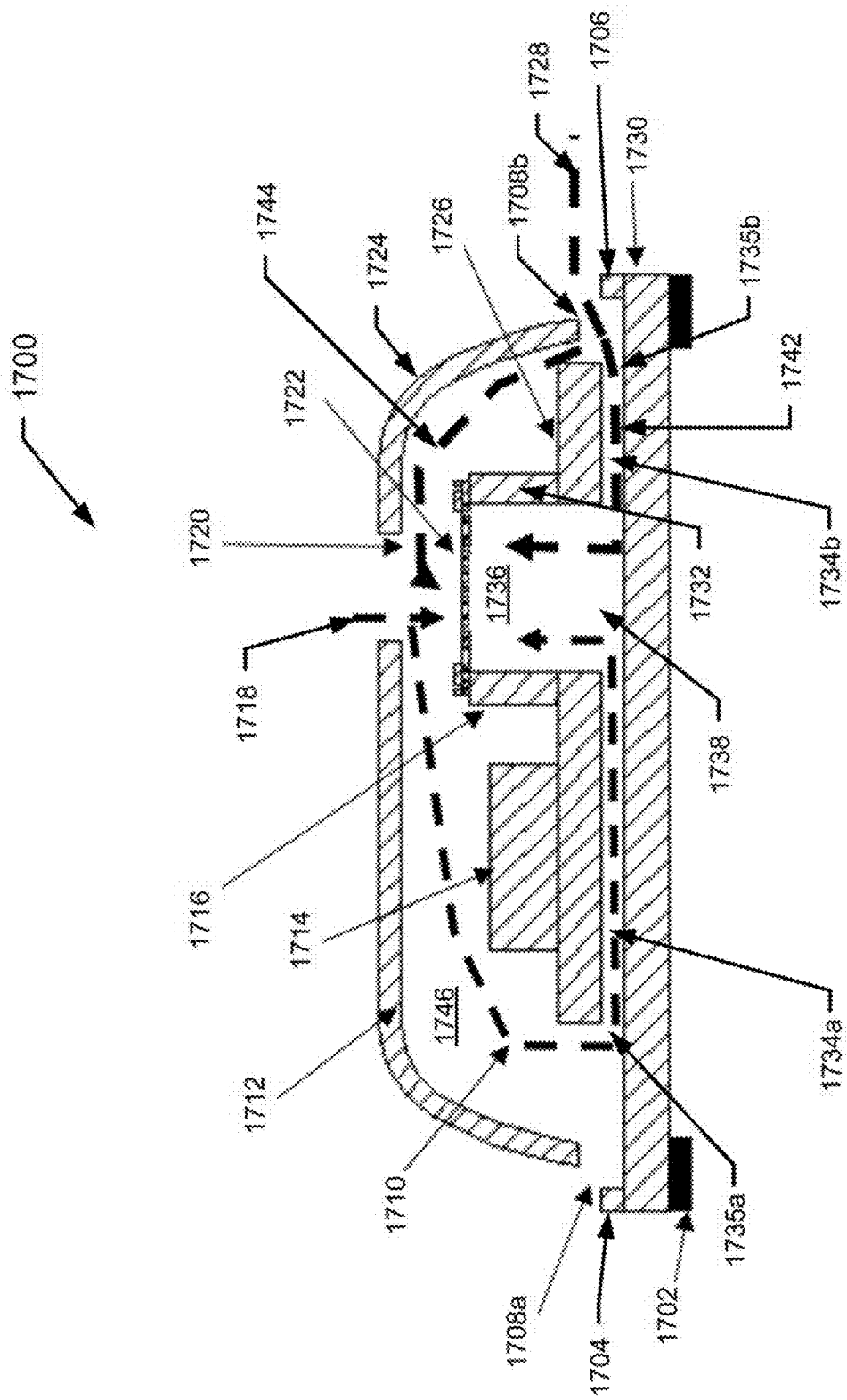

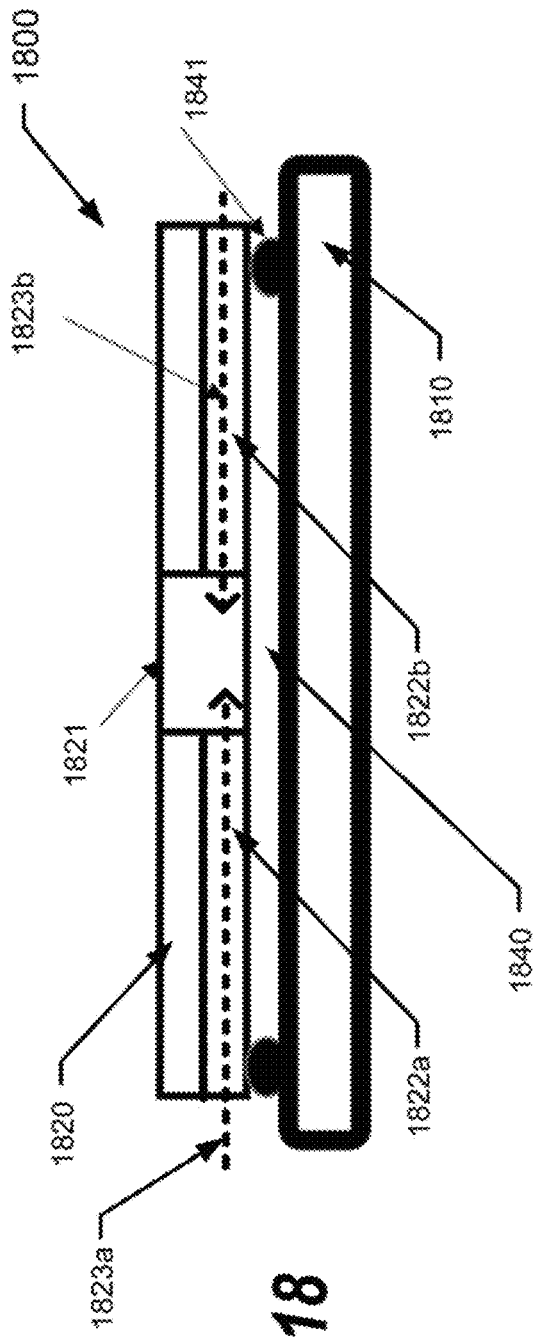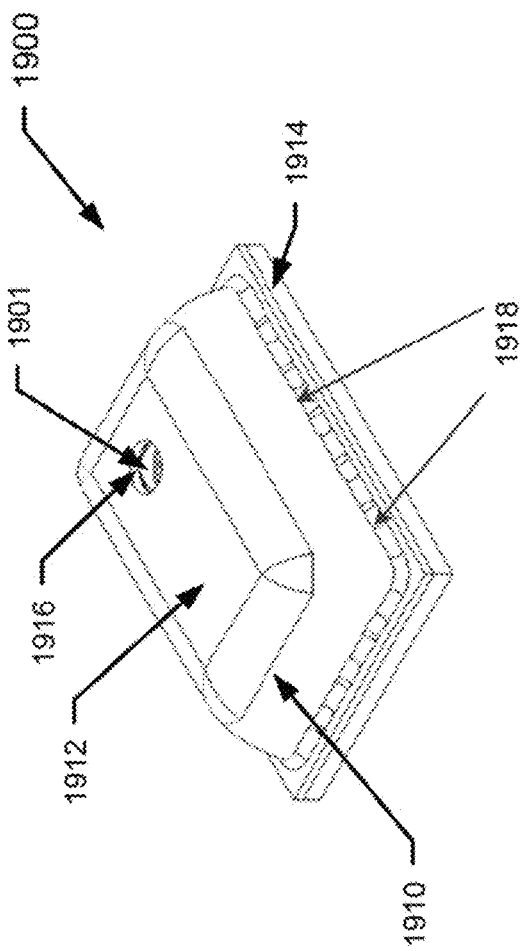

DIRECTIONAL MICROPHONE AND ASSOCIATED PACKING TECHNIQUES

INCORPORATION BY REFERENCE

This application is a continuation application of U.S. application Ser. No. 15/354,682, filed on Nov. 17, 2016, which was filed under 35 U.S.C § 111(a) claiming the benefit pursuant to 35 U.S.C. § 119(e) (1) of the filing dales of U.S. Provisional Application No. 62/257,092, "Pressure Sensor Packaging Design for Water Proof Applications" filed on Nov. 18, 2015, and U.S. Provisional Application No. 62/397,186, "A Directional Microphone and Packaging Technique for Creating the Directional Microphone" filed on Sep. 20, 2016 pursuant to 35 U.S.C. § 111(b). The entire contents of all of the above are incorporated herein by reference.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior an against the present disclosure.

The mobile communication industry is evolving at a fast phase. One part of the evolution is the introduction of wristwatch mobile phones. Because wristwatch mobile phones are worn on wrists, certain components of the wristwatch mobile phones are more likely to be exposed to liquid damage than that of normal mobile phones which are usually kept in a protective environment (e.g. pockets). Even for normal mobile phones, there are components that have to be exposed to the outside environment. An example of the above mentioned components is the acoustic pressure sensor in a microphone for sensing sound wave pressure. These components have to be protected from being exposed to external damaging factors, such as rain or water, in order to operate properly.

Further, surrounding system noise can severely degrade voice quality of a microphone, and therefore a directional microphone offers better voice quality due to its ability to only pick up sound signals in a certain direction. However a majority of mobile devices use omnidirectional microphones due to unavailability of cost effective directional microphones. In addition, electronic noise-canceling techniques used in omni-directional or directional microphones often fail to keep up with changes in noise and are thus unable to effectively cancel background noise.

SUMMARY

Aspects of the disclosure provide a waterproof packaging technique which can be used for fabricating waterproof microphones in mobile devices. The waterproof packaging technique employs a liquid-resistant air inlet passive device (LRAPD) which can include a liquid-repellant channel and can be attached to an opening in a housing enclosing an acoustic pressure sensor. In one example, the inner surface of the LRAPD is coated with a self-assembled monolayer (SAM) to realize the waterproof function.

A device based on the waterproof packaging technique can include a microelectromechanical system (MEMS) device, a housing enclosing the MEMS device, and a liquid-resistant air inlet passive device (LRAPD) on the housing. The LRAPD can include at least one channel connecting an exterior of the housing with a chamber formed between the housing and the MEMS device. An inside surface of the channel can be coated with a liquid-repellant coating. In some examples, the liquid-repellant coating can be a self-assembled monolayer (SAM) coating. The LRAPD can be attached to an inner side of the housing with an inlet of the channel connected to an opening in the housing, or attached to an outer side of the housing with an outlet of the channel connected to an opening in the housing. Alternatively, the LRAPD can be disposed in an opening of the housing.

In one example, the LRAPD includes multiple channels connecting an exterior of the housing with the chamber, and surfaces of the multiple channels are coated with a liquid-repellant coating. In some examples, the housing can include a cover over a substrate supporting the MEMS device, and the LRAPD can be disposed on the substrate.

The MEMS device can be a pressure sensor, such as a piezoresistive pressure sensor, a capacitive pressure sensor, and the like in various examples. In one example, the MEMS device is an acoustic pressure sensor with a sensing surface facing the chamber for sensing an acoustic wave, and the LRAPD is formed in a direction of the sensing surface to allow the acoustic wave to reach the sensing surface without dampening the acoustic wave. In another example, a surface of a diaphragm opposite the sensing surface faces the chamber, and the LRAPD is configured to provide an air pressure in the chamber that is equal to atmospheric pressure. Accordingly, in one example, the LRAPD includes a zigzag channel.

In a further example, the acoustic pressure sensor includes a cavity between the sensing surface and a housing with an opening in the housing connecting the cavity with the exterior of the housing, and the LRAPD covers the opening.

In one example, the LRAPD includes a zigzag channel. In another example, the LRAPD includes a cavity proximate the channel to collect liquid. In a further example, the MEMS device is an acoustic pressure sensor with a sensing surface facing the chamber, and the channel of the LRAPD includes a portion sloping from one end to the other end with respect to the sensing surface to allow an acoustic wave to reach the sensing surface. In one example, the MEMS device is an acoustic pressure sensor with a sensing surface facing the chamber, and the channel of the LRAPD includes a longest portion running parallel from a first end to a second end with respect to the sensing surface to allow an acoustic wave to reach the sensing surface.

Aspects of the disclosure provide another packaging technique for making a directional microphone. The packaging technique employs mechanical structures to cancel undesired background noise to realize directional picking up functions instead of requiring an extra sensor in electronic noise-cancelling techniques. Accordingly, the packaging technique enables a directional microphone with a reduced footprint and cost.

A directional microphone device based on the packaging technique can include an acoustic sensor and a housing enclosing the acoustic sensor. The acoustic sensor can include a sensing diaphragm for sensing sound pressure, a cavity below the sensing diaphragm, and a first substrate. The directional microphone device can further include a channel with an inlet open at an edge of the first substrate and an outlet connected with the cavity. The housing can include a cover attached to a second substrate supporting the first substrate. The cover can include a first opening over the sensing diaphragm and a second opening at a side of the cover. The second opening can be disposed adjacent to the inlet of the channel.

In some examples, a first distance of a first path from the second opening to the sensing diaphragm via the channel is configured to be equal to a second distance of a second path from the second opening to the sensing diaphragm via a chamber between the cover and the acoustic sensor.

In some examples, the directional microphone device includes multiple channels each having an inlet open at the edge of the first substrate and an outlet connected with the cavity. The multiple channels can extend from the cavity to the edge of the first substrate, and can be evenly distributed from each other. In some examples, the cover includes multiple second openings at sides of the cover. The multiple second openings can be evenly distributed along the edge of the cover. In addition, in some examples, the multiple second openings are positioned adjacent to respective inlets of the multiple channels.

The acoustic sensor can be fabricated with MEMS technology. The acoustic sensor can be a capacitive pressure sensor, or a piezoresistive pressure sensor, and the like. In some examples, the microphone device can include an anechoic chip disposed over the cover and configured to absorb sound waves reaching the anechoic chip.

In one example, the first substrate is bonded to the second substrate. In another example, the channel is formed between the first substrate and the second substrate. In a further example, the first substrate and the second substrate are a same substrate made from a silicon wafer.

In one example, the second substrate further includes a barrier wall disposed outside the housing at an edge of the second substrate and adjacent to the second opening outside the housing. In one example, the barrier wall is configured to block sound waves inside the housing from leaving the housing, and to block sound waves outside the housing from entering the housing.

In one example, the acoustic sensor includes sidewalls attached to the sensing diaphragm and the first substrate to form the cavity. In another example, the first substrate includes an opening below the cavity. In a further example, the sensing diaphragm is attached to the first substrate, and the cavity is positioned within the first substrate.

BRIEF DESCRIPTION OF THE DRAWINGS

Various embodiments of this disclosure that are proposed as examples will be described in detail with reference to the following figures, wherein like numerals reference like elements, and wherein:

FIG. 1 shows a waterproof device according to some examples of the disclosure;

FIG. 12 shows another pressure sensor device using the waterproof packaging technique described above according to some examples;

FIG. 15A shows a capacitive pressure sensor with sound pressure exerted on one side of a sensing surface;

FIG. 15B shows how sound pressures of two synchronized sound waves are cancelled at a capacitive pressure sensor;

FIG. 17 shows a sectional view of all example unidirectional microphone device according to some examples;

FIG. 18 shows a sectional view of an example substrate structure;

FIG. 19 shows a perspective view of an example unidirectional microphone device;

DETAILED DESCRIPTION OF EMBODIMENTS

Figure 2A:
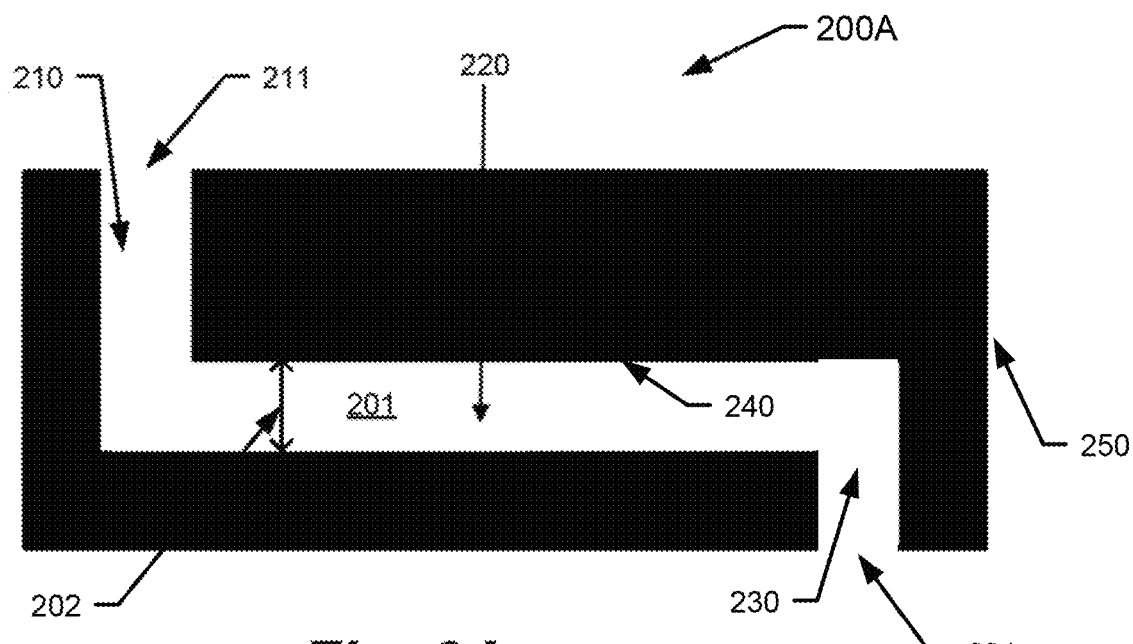
FIG. 2A shows a sectional view of a liquid-resistant air inlet passive device (LRAPD) having a horizontal middle portion according to some examples.

FIG. 1 shows a waterproof device 100 according to some examples of the disclosure. The device 100 includes a microelectromechanical system (MEMS) device 130, a cover 120, and a substrate 140. The cover 120 and the substrate 140 form a housing 160 enclosing the MEMS device 130. A chamber 161 is thus formed between the cover 120 and the MEMS device 130. The housing 160 can prevent outside particles, for example, water droplets, dust, and, the like, from entering the chamber 161 to damage the MEMS device 130 or degrade performance of the MEMS device 130.

The housing 160 includes an opening 121 that provides a passage connecting the chamber 161 with the environment outside the housing 160. For example, the MEMS device 130 can be an acoustic pressure sensor for sensing a sound waves coining from outside the housing 160. The opening 121 can provide a path for the sound waves to reach the MEMS device 130.

According to an aspect of the disclosure, in dry air applications, such as air pressure sensors used in mobile phones, walkie-talkies, or wristwatch mobile phones, a sensing surface of the MEMS device 130 needs to be exposed to ambient environment to receive a sound wave pressure, or/and an opposite surface of the sensing surface needs to be vented to the atmosphere in order to operate properly. At the same time, the MEMS device 130 needs to be protected from damage caused by liquid, such as water, in the ambient environment. To serve this purpose, a waterproof packing technique is provided in the disclosure. Specifically, a liquid-resistant air inlet passive device (LRAPD)) 110 is employed for packaging the device 100. As shown, the LRAPD 110 is attached to the cover 120 below the opening 121. The LRAPD 110 includes a liquid-resistant channel 111 which connects the chamber 161 with the opening 121 providing a path between the outside environment and the interior of the housing 160. The liquid-resistant channel 111 exposes or vents the MEMS device 130 to the air while repulsing any liquid from entering into the chamber 161.

In some pressure sensing applications, a waterproof gel coating can be used to cover an outer surface of a pressure sensor, such as the MEMS device 130 in FIG. 1, to protect the pressure sensor. However, for ultra-low pressure sensing applications, such as microphones for sound pressure sensing, thickness of a sensing diaphragm of a pressure sensor is in a range of a few micrometers, and any gel coating may deteriorate performance of such type of pressure sensor. In such scenario, a LRAPD 110 can be more advantageous than a gel coating on the pressure sensor.

In various examples, the MEMS device 130 enclosed by the housing 160 can be any suitable MEMS devices which utilizes exposure to external environment of the housing 160. Generally, an MEMS device contains parts or components of a size ranging from 1 micrometer to 1 millimeter that perform engineering functions by electromechanical means. A MEMS device can include micro sensors or actuators made of micromechanical structures, and auxiliary integrated circuits for device function controls and signal transductions. In some examples, the MEMS device 130 is configured to be a pressure sensor, such as a capacitive pressure sensor, a piezoresistive pressure sensor, and the like. Specifically, in some examples, the MEMS device 130 is configured to be acoustic pressure sensor for sensing a sound wave pressure.

In one example, the substrate 140 is a part of the MEMS device 130. For example, the substrate 140 is a portion of a silicon wafer which is used for fabricating one or more parts of the MEMS device 130, and the cover 120 is bonded and sealed to the substrate 140 to form the chamber 161. In another example, the MEMS device 130 is fabricated on a silicon die that is attached to the substrate 140 that is a part of a packaging housing, and the cover 120 is then sealed to the packaging substrate 140 to form the chamber 161. In the above two examples, the cover or the package housing can be made of any suitable materials, such as plastics, metals, ceramics, glass, and the like.

In various examples, the MEMS device 130 can include additional microelectronics 150 (e.g., electronic circuits or components) cooperating with the MEMS device 130 to fulfill various functions.

FIG. 2A shows a sectional view of a LRAPD 200A according to some examples. The LRAPD 200A includes a channel 201. The channel 201 includes a first portion 210, a second portion 220 (a middle portion) and a third portion 230 sequentially connected to form the channel 201. In one example, the middle portion is perpendicular to the first portion 210 and the third portion 230 as shown in FIG. 2A.

The channel 201 includes an inlet 211 and an outlet 231. In one example, the channel is formed in a piece of silicon material 250. The LRAPD 200A further includes a liquid-repellant coating 240 covering at least part or all of an inner surface of the channel 201. In addition, a size 202 of the channel 201 (e.g., diameter of the channel) can vary depending on requirements of various applications. In some examples, size of a channel in a LRAPD can be in a range of 2-50 micrometers, while in other examples, size of a channel in a LRAPD can be in a range of 50-500 micrometers.

According to an aspect of the disclosure, the liquid-repellant coating 240 can cause the hydrophobic effect when a water droplet is disposed at the surface of the liquid-repellant coating 240 such that the droplet water tends to form a spherical shape. As a result, when the size of the water droplet is larger than the size 202 of the channel 201, the water droplet will be repelled from entering the channel 201. For example, when the LRAPD 200A is installed proximate an opening of a housing enclosing an acoustic pressure sensor for a mobile device, water droplets caused by rain or other ambient factors will be repelled from entering the housing when the mobile device is exposed to the ambient environment. In some instances, it is possible that water droplets with a smaller size may enter through the inlet 211, however, these can be prevented from passing further through the channel 201 due to the liquid-repellant coating 240 and the structure of the channel 201.

In some examples, the liquid-repellant coating 240 is made of a self-assembled monolayer (SAM) coating, for example, generated from a wet chemistry based process. In one example, the SAM coated surface of the channel 201 is extremely hydrophobic, and water contact angles thus formed can be greater than 90°. In addition, the thickness of a SAM coating can be molecularly thin and in a range of 2-3 nanometers.

Figure 2B:
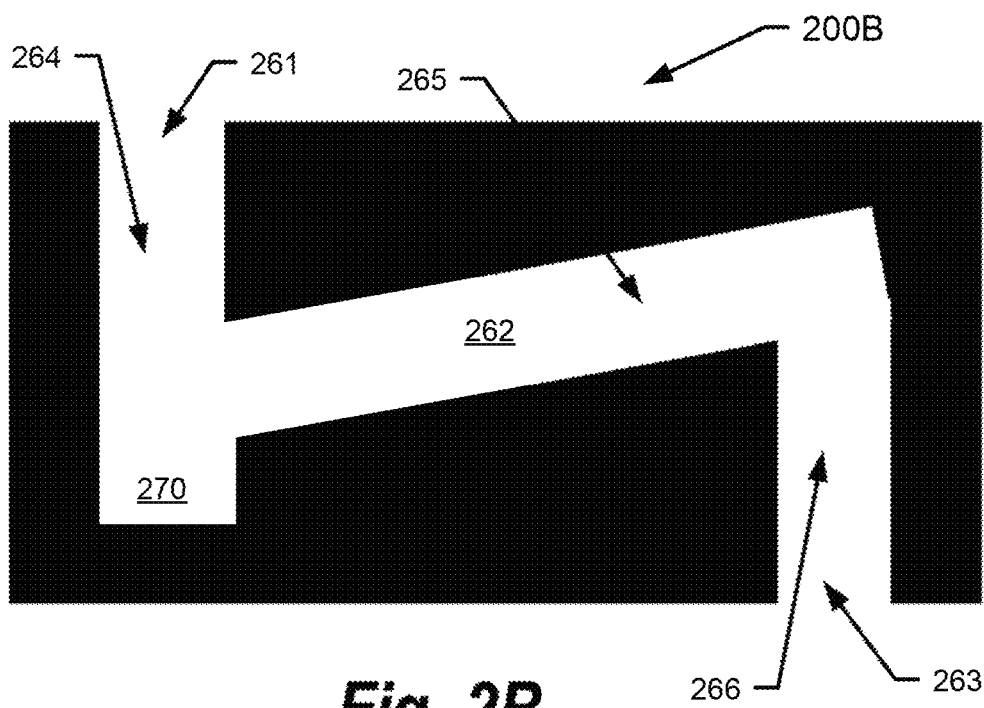
FIG. 2B shows a sectional view of another LRAPD having a sloping middle portion according to some examples.

FIG. 2B shows a sectional view of another LRAPD 200B according to some examples. The LRAPD 200B includes a channel 262 that has an inlet 261 and au outlet 263 at two ends of the channel 262. The channel 262 includes a first portion 264, a second portion 265 (a middle portion) and a third portion 266 sequentially connected to form the channel 262. The LRAPD 200B can also include a liquid-repellant coating covering at least part or all of an inner surface of the channel 262. The channel 262 can be formed in a piece of silicon material 250. However, different from FIG. 2A example, the second portion 265 of the channel 262 slopes from one end to the other end.

In one example, the LRAPD 200B is attached to a cover and is parallel to a sensing surface of an MEMS device. Accordingly, the middle portion 265 is sloped with respect to the sensing surface of the MEMS device 130. In one example, the LRAPD includes a cavity 270 below the bottom portion of the channel 262 for collecting water passing through the inlet 261. In this way, the water inside the channel 262 will not block sound waves from passing through the channel 262. The stored water may later disappear gradually through evaporation. In one example, absorbent materials are filled in the cavity for holding liquid. The absorbent materials can include Polyvinyl Alcohol (PVA) sponges, polyester sponges, and the like. In other examples, the LRAPD may not include the cavity and in the case that a water droplet having a size smaller than that of the inlet 261 enters the channel 262, the water droplet can be retained at a bottom portion at the lower end of the second portion 265. As a result, the water droplet is prevent from further going through the channel 262 after entering through the inlet 261 due to the sloped channel.

It is noted that a LRAPD can have various configurations depending on packaging requirements of various applications. For example, the channel can be in any form and shape. The size and length of the channel can vary depending on the application. For devices likely to be subject to wetter conditions, the channel can be made longer to reduce liquid absorption and transfer into the chamber of the housing. For devices less likely to be subject to wet conditions, the channel can be shorter to reduce manufacturing costs. The number of channels of a LRAPD can be larger than one. The channel can be either strait or zigzag, or any other forms. In addition, a LRAPD can be mounted outside or inside a housing enclosing a MEMS device, or in the plane of an opening in the housing thus being merged with the housing. When mounted outside the housing, the outlet of the LRAPD can be aligned with an opening of the housing, while when mounted inside the housing the inlet of the LRAPD can be aligned with the opening of the housing. Further, in some examples, an opening in a housing can be positioned at any suitable locations, for example, top, bottom, or side of the housing, for disposing a LRAPD proximate the opening. Furthermore, a LRAPD can be made of any suitable materials in addition to silicon materials, such as plastics, metals, ceramics, glass, polysilicon, silicon dioxide, and the like.

Figure 3A:
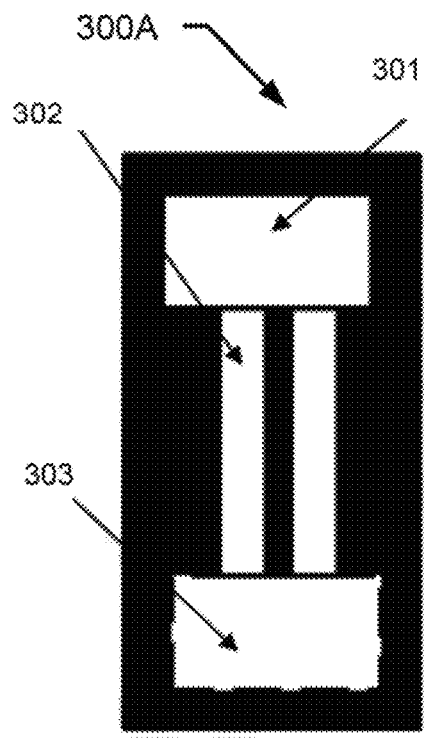
FIG. 3A shows a top view of a first example of a LRAPD.
Figure 3B:
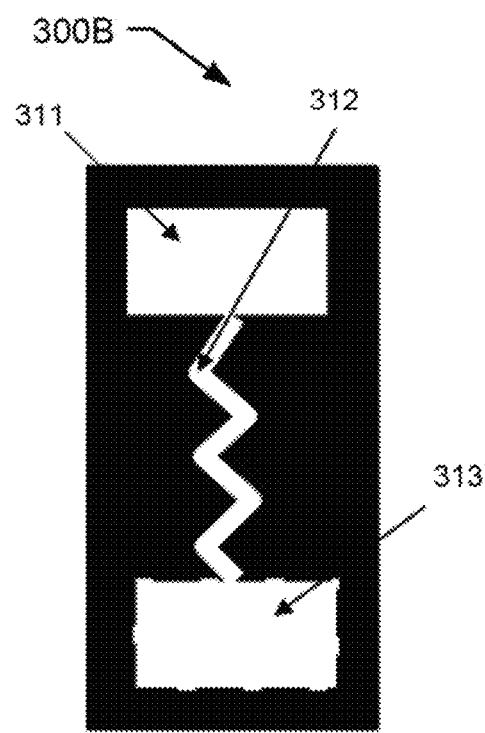
FIG. 3B shows a top view of a second example of a LRAPD.

FIGS. 3A/3B/4A/4B/5 show some examples of LRAPDs with different designs. FIG. 3A shows a top view of a first version of a LRAPD 300A. The LRAPD 300A includes an inlet 301 opening upward, an outlet 303 facing downward, and two separate channels 302 arranged in parallel connecting with the inlet 301 and the outlet 303 at opposite ends. FIG. 3B shows a top view of a second version of a LRAPD 300B. Similarly, the LRAPD 300B includes an inlet 311 opening upward, an outlet 313 facing downward and a channel 312 connecting with the inlet 311 and the outlet 313. However, the channel 312 has a zigzag form, and is longer and narrower than either one of the channels 302. Accordingly, the LRAPDs 300A and 300B can be used for different purposes in acoustic pressure sensors. For example, the LRAPD 300A can be used for exposing sound pressure to a sensing surface of a pressure sensor such that the sound wave pressure can reach the sensing surface without being hindered. In contrast, the LRAPD 300B can be used for venting a chamber behind the sensing surface to the atmosphere such that the chamber has an air pressure equal to the atmospheric pressure.

Figure 4A:
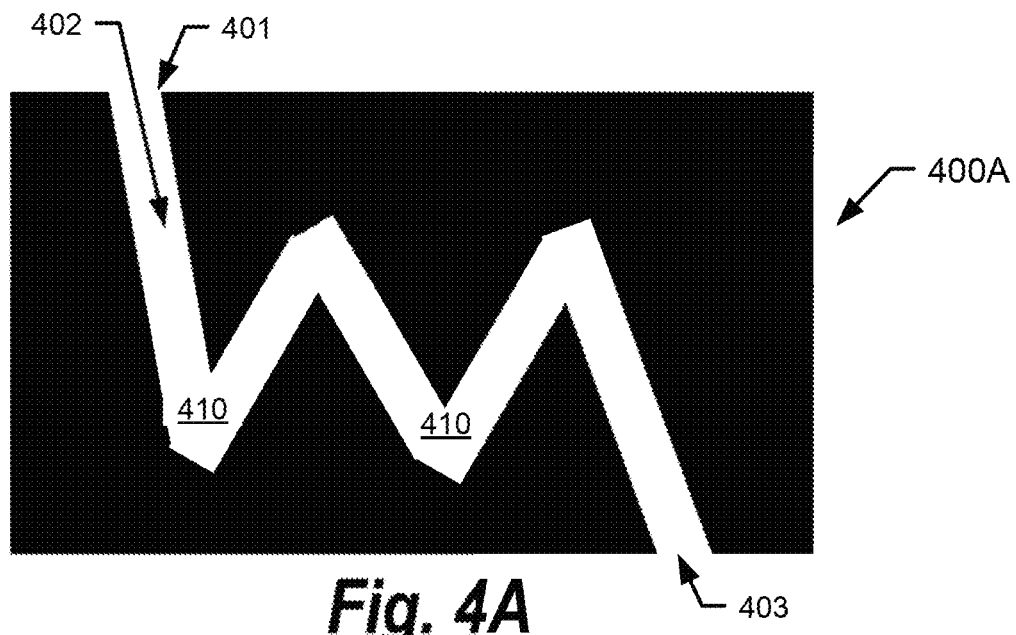
FIG. 4A shows a section view of a third example of a LRAPD.
Figure 4B:
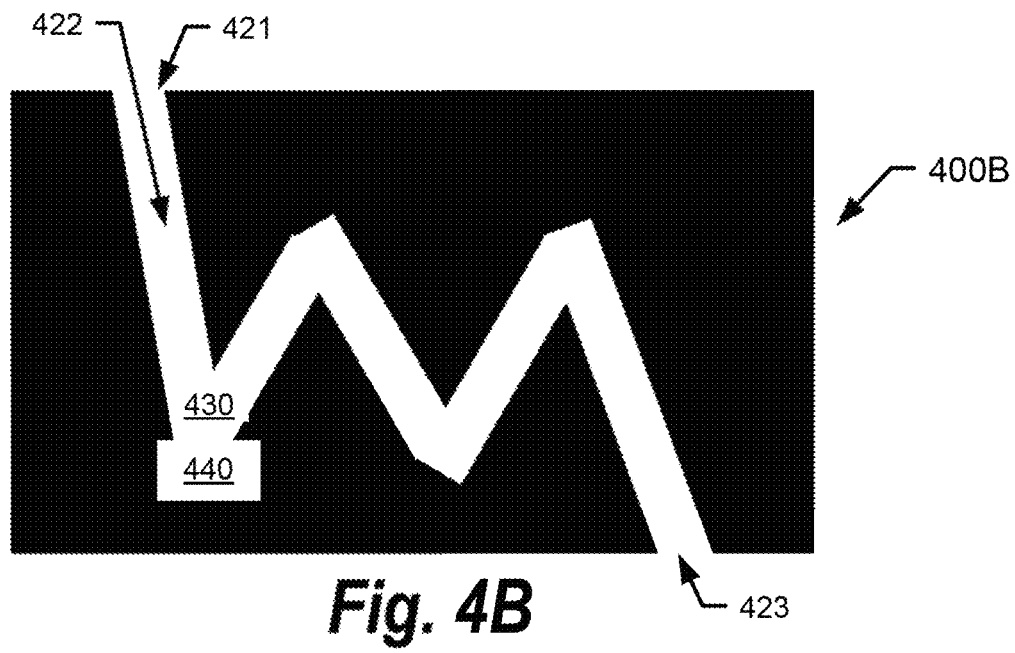
FIG. 4B shows a section view of a fourth example of a LRAPD.

FIG. 4A shows a section view of a third version of a LRAPD 400A. The LRAPD 400A includes a channel 402 that has a zigzag form in vertical direction. Due to the vertical zigzag structure, when a water droplet enters the channel 402 from an inlet 401, the water droplet can be retained at a bottom portion 410 of the channel 402, thus reducing possibility for the water droplet to reach an outlet 403 of the channel 402. The retained water droplet can evaporate later. FIG. 4B shows a section view of a fourth version of a LRAPD 400B which has a form similar to that of the LRAPD 400A. The LRAPD 400B includes a channel 422 having an inlet 421 and an outlet 423. The channel 422 may have a bottom portion 430 as shown in FIG. 4B. However, different from LRAPD 400A, the LRAPD 400B may additionally include a cavity 440 at below the bottom portion 430. The cavity 440 can function as a liquid reservoir for receiving water droplets entering the inlet 421 and storing the received water temporarily. In this way, more water droplets can be retained at the cavity, and sound waves can still pass through the channel 422 without being blocked by the retained water. Water stored in the cavity 440 can later evaporate into the atmosphere and/or the cavity 440 can store a material such as a sponge to absorb liquid.

Figure 5:
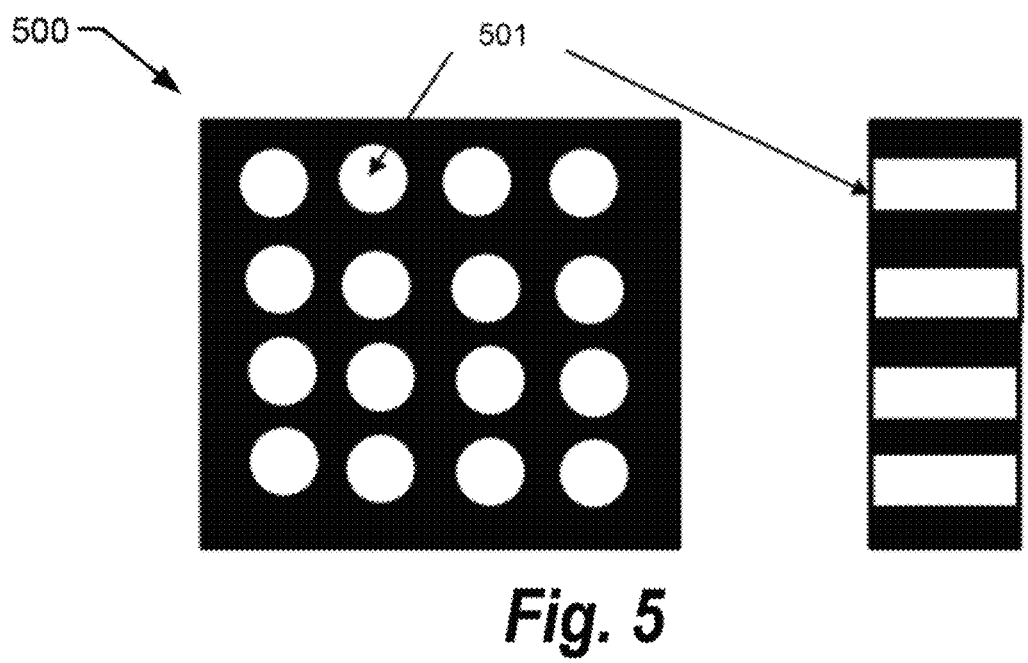
FIG. 5 shows a top view and a side view of a fifth example of a LRAPD.

FIG. 5 shows a top view and a side view of a fifth version of a LRAPD 500 on the left and right side of FIG. 5, respectively. The LRAPD 500 takes a form of a square chip with multiple channels 501 going through the chip from one side to another side. In various examples, the length, size, number and position arrangement of the multiple channels 501 may vary. This allows sound to travel through the LRAPD 500 while preventing or hindering liquid from passing through to the interior chamber. The fifth version LRAPD 500 provides multiple channels 501 for sound waves going through without being dampened. An application example of the fifth version LRAPD 500 is shown in FIG. 12.

Figure 6:
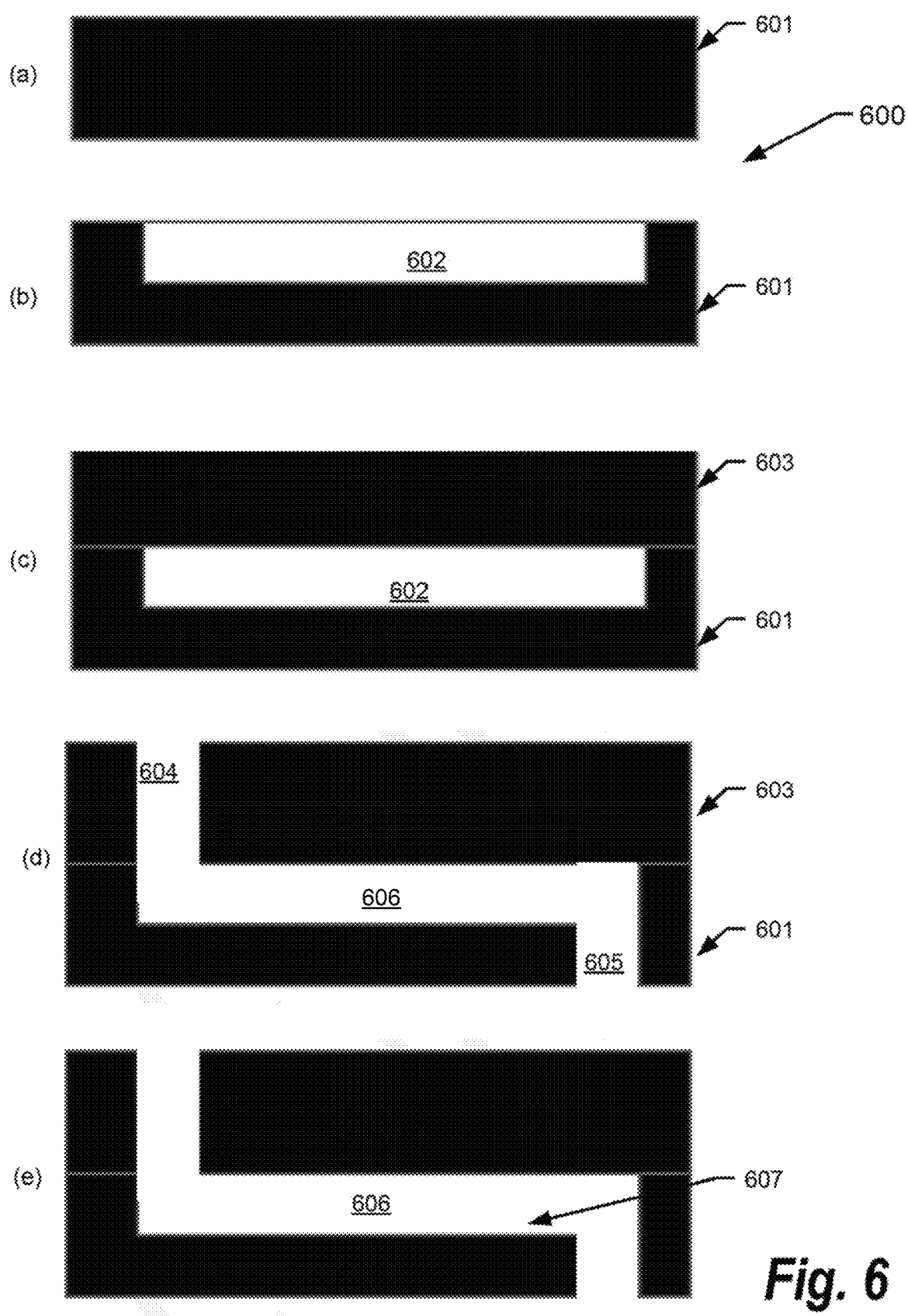
FIG. 6 shows an example of a fabrication process sequence for fabricating a LRAPD)

FIG. 6 shows an example of a fabrication process sequence 600 for fabricating a LRAPD. Standard semiconductor processing technology can be used to fabricate a LRAPD in some examples. The fabrication process sequence 600 can include multiple steps, and diagrams (a) to (e) in FIG. 6 represent part of the multiple steps.

First, a first silicon wafer 601 is prepared as shown in diagram (a). The silicon wafer 601 can be of any suitable type as known by one of ordinary skill in the art. Second, a channel 602 is patterned and etched in the first wafer 601 as shown in diagram (b). Third, optionally, a silicon oxide layer can be grown on the entire first wafer 601. Next, as shown in diagram (c), a second wafer 603 can be bonded over the first wafer 601 thus forming a channel 602. Similarly, the second wafer 603 can be of any suitable types. Any suitable bonding mechanisms can be used for the fabrication. Then, both wafers 601 and 603 can be ground down into a thin substrate such that thickness of the LRAPD is reduced. This step can be optional and the thickness of the final LRAPD can vary depending on interior space of a housing enclosing a MEMS device. Next, as shown in diagram (d), air inlet ports 604 and 605 are etched in both wafers 601 and 603 at the opposite ends of the channel 602 to form a channel 606. Finally, as shown in diagram (e), a SAM coating is formed on all or part of the inner surface of the channel 606, the inlet 604 and outlet 605.

It is noted that silicon materials are used in the FIG. 6 example, however fabrication of a LRAPD is not limited to silicon materials. Any suitable materials, such as plastics, metals, ceramics, and the like, can be used for fabricating a LRAPD with various fabrication processes.

Figure 7:
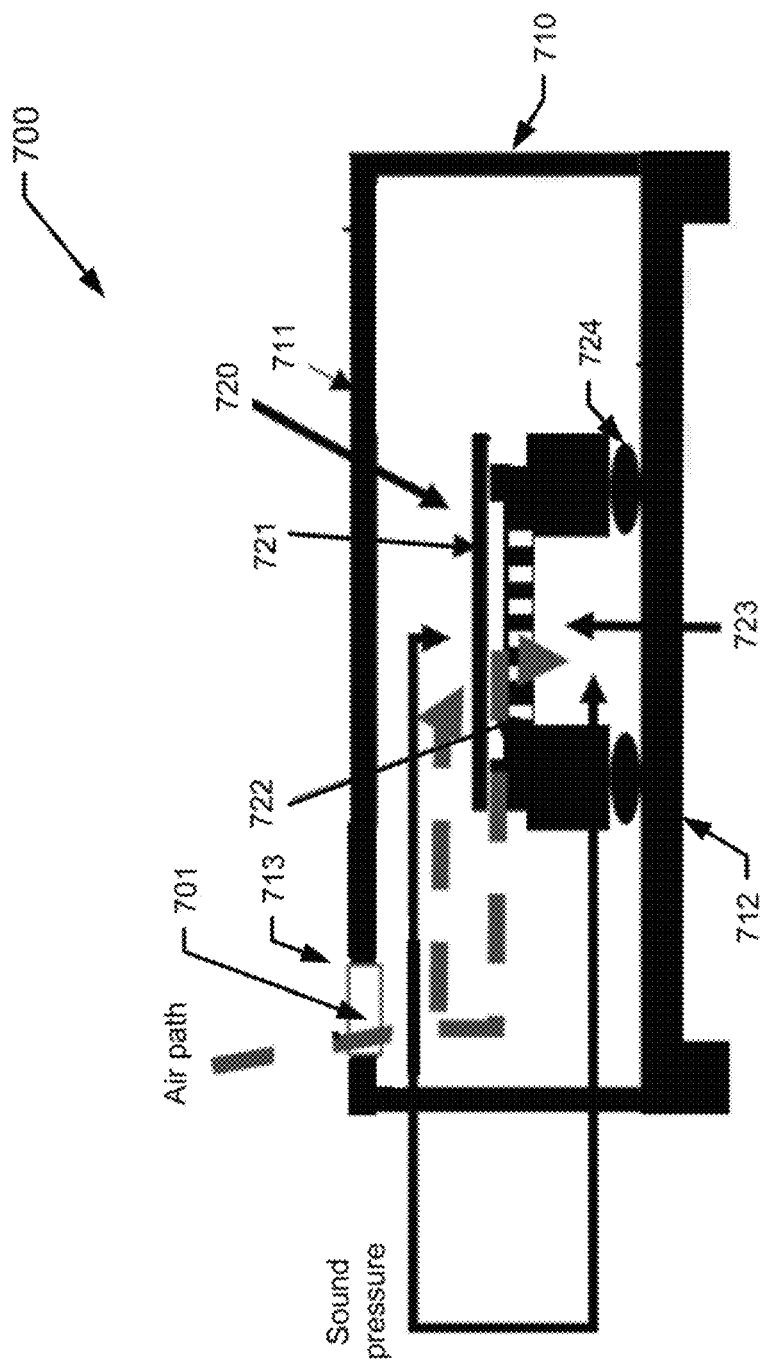
FIG. 7 shows a pressure sensor device using the waterproof packaging technique described herein according to some examples.

FIG. 7 shows a pressure sensor device 700 using the waterproof packaging technique described herein according to some examples. The device 700 can include a housing 710 formed by a cover 711 and a substrate 712, and a pressure sensor 720 enclosed in the housing 710. In addition, an opening 713 can be formed on the cover 721, and a LRAPD 701 is disposed in the opening 713. The LRAPD 701 can include one or more channels coated with a liquid-repellant coating, such as a SAM coating.

In various examples, the pressure sensor 720 can be an absolute, gage or differential measurement device. Generally, a pressure sensor measures a certain pressure in comparison to a reference pressure, and pressure sensors can be categorized into three types of devices: absolute, gage and differential devices. Absolute pressure sensors measure the pressure with respect to a high vacuum reference sealed in a cavity behind a sensing diaphragm. Gage pressure sensors measure the pressure relative to ambient atmospheric pressure. Differential pressure sensors measure a difference between two pressures on opposite sides of a sensing diaphragm. For gage pressure sensor one side opposite the sensing side of the diaphragm has to be exposed to atmospheric pressure. In addition, the pressure sensor 720 can be sensors based on various physical mechanisms. For example, the pressure sensor 720 can be a capacitive pressure sensor or a piezoresistive sensor in different examples.

In FIG. 7, a capacitive pressure sensor 720 is used as an example for illustrating the waterproof technique. The capacitive pressure 720 is fabricated with MEMS technology and includes micromechanical structures. As shown, the capacitive pressure sensor 720 includes a diaphragm (moving plate) 721 and a back plate (fixed plate) 722. Two electrodes attached to the diaphragm 721 and the back plate 722 form a capacitor. The back plate 722 is perforated such that a cavity 723 below the back plate 722 is connected with the gap between the diaphragm 721 and the back plate 722. In addition, the capacitive pressure sensor 720 is attached to the substrate 712 by some sealing materials 724. In one example, the capacitive pressure sensor 720 is fabricated on a silicon die separated from a silicon wafer that includes multiple units of pressure sensors generated from a fabrication process.

While the air is allowed to go through the LRAPD 701, water droplets can be prevented from entering the housing 710 due to liquid resistant function of the LRAPD 701.

In one example, the capacitive pressure sensor 720 is configured to be an acoustic pressure sensor 720 performing gage pressure measurement. The acoustic pressure sensor 720 includes a venting path (not shown) which provides a path allowing air coming from the opening 713 to enter the cavity 723. At the same time, the air coming from the opening 713 can also reach the sensing, surface (upper surface in FIG. 7). As a result, both the sensing surface and back surface (bottom surface in FIG. 7) of the diaphragm 721 are exposed to the same atmospheric pressure, which provides a condition required for gage pressure measurement. In another example, the capacitive pressure sensor 720 is a barometric pressure sensor 720 performing absolute pressure measurement. Accordingly, the chamber 723 may be sealed to form a vacuum.

In one example, the capacitive pressure sensor 720 is an acoustic pressure sensor 720 for sensing sound wave pressure, and the device 700 is configured to be a microphone, for example, used in a mobile device. During the operation of the acoustic pressure sensor 720, sound pressure is allowed to enter the housing 710 through a channel of the LRAPD 701 and reach the sensing surface of the diaphragm 721. As a response, the diaphragm 721 vibrates according to changes of sound pressure exerted on the diaphragm 721 and causes variations in capacitance value of the capacitor formed by the diaphragm 721 and the back plate 722. The changes in capacitance value can be subsequently measured by auxiliary microelectronics of the device 700 and reflected in a current or voltage signal processed by the device.

Figure 8:
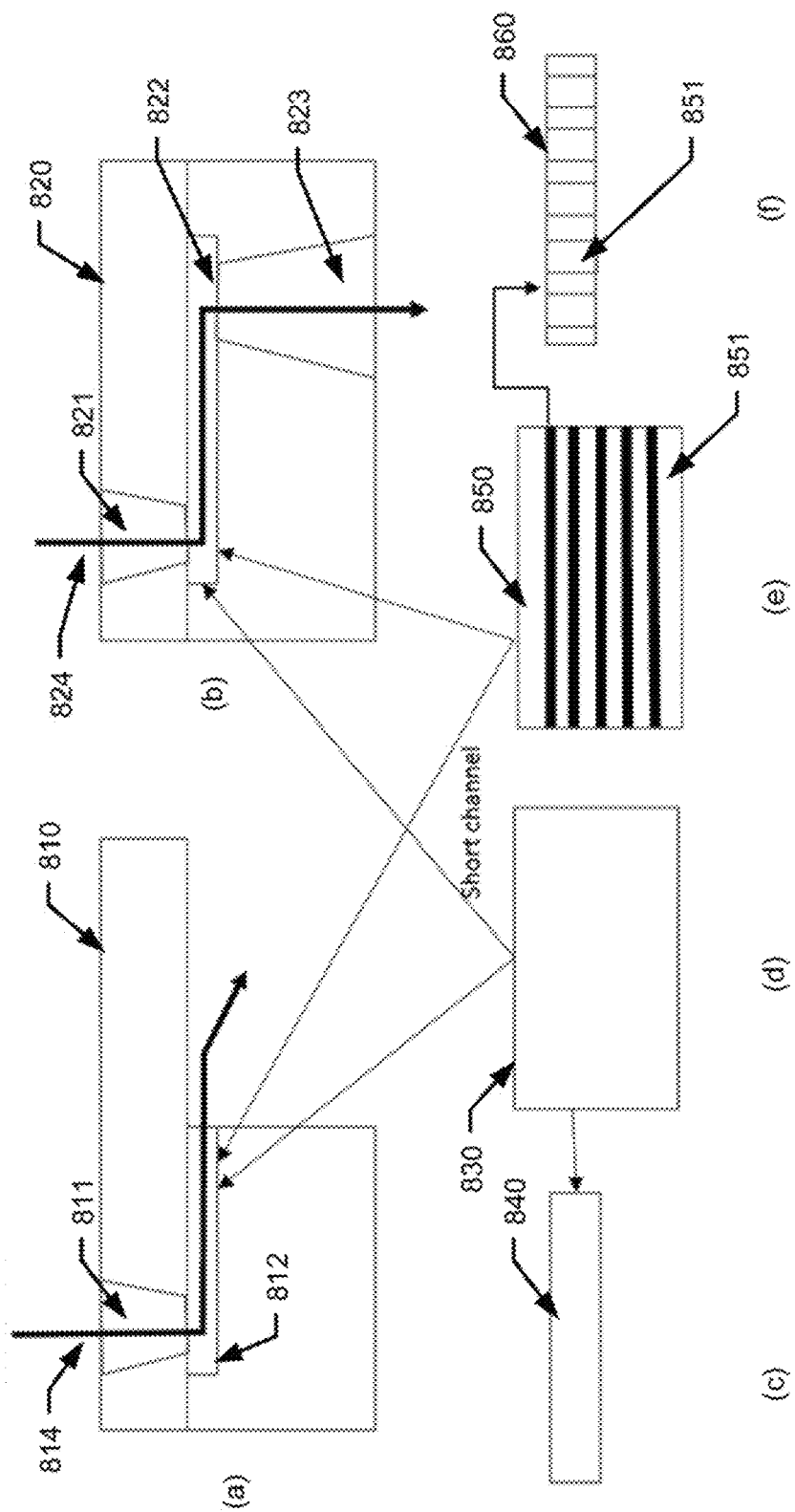
FIG. 8 shows structural variations of LRAPDs according to some examples.

FIG. 8 shows several diagrams illustrating structure variations of LRAPDs according to some examples. LRAPDs with these structures can be used in FIG. 7 example. As shown, diagram (a) is a cross sectional view of a LRAPD 810 which includes an inlet 811 and a channel 812. A channel formed by the inlet 811 and the channel 812 provides a path 814 for a sound wave to pass through the LRAPD 810 and enter the housing 710. Diagram (b) shows a cross sectional view of another LRAPD 820 which includes an inlet 821, a channel 821, and an outlet 823. A channel formed by the inlet 821, the channel 821, and the outlet 823 provides a path 824 for a sound wave entering the housing 710.

Diagrams (d) and (e) show two different tunnel structures 830 and 850 in top view that can be used in either of the channels 812 and 822. Accordingly, diagrams (c) and (f) shows cross sectional views of the two channel structures 830 and 850 respectively. As shown, the channel structure 830 has only one channel, while the channel structure 850 has multiple channels 851.

It is noted that dimensions of the channel of the LRAPD 701 can be determined according to requirements of specific applications. For example, in applications of acoustic pressure sensing, such as microphones in a mobile device, the LRAPD 701 is used to expose sound wave to the sensing surface of the diaphragm 721. In order to prevent water droplets from entering the housing 710, the cross section size of a channel of the LRAPD 701 needs to be smaller than a certain dimension. On the other side, the dimension of the channels of the LRAPD 701 needs to be large enough to allow the sound wave going through without damping or distorting the sound wave. Accordingly, in one example, a LRAPD with the channel structure 850 having multiple channels 851 can be employed. The multiple channels 851 together provide a broad passage for the sound wave while each channel 851 has a size small enough for repelling water droplets. In another example, a LRAPD with the structure 840 having a single channel that has a narrow cross section is employed. In one example, the cross section area of a channel in the LRAPD is selected to be less than a circle with a diameter of 10 micrometers. In another example, the dimension of a channel in the LRAPD is determined to be in a range of 10-100 micrometers. In addition to numbers and size of channels in the LRAPD 701, the length of the channels of the LRAPD 701 can be determined to be relatively short such that the sound wave can reach the sensing surface without being dampened.

Figure 9:
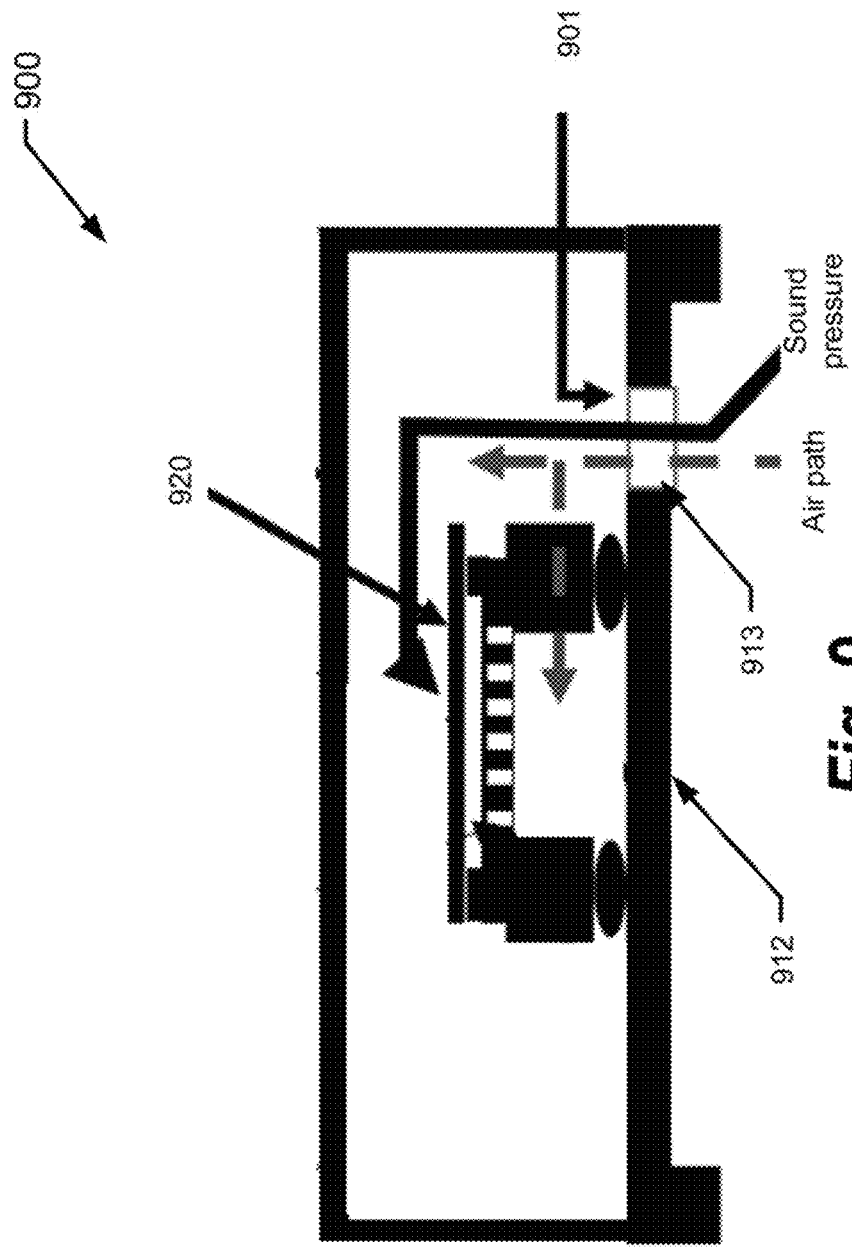
FIG. 9 shows another pressure sensor device using the waterproof packaging technique described above according to some examples.

FIG. 9 shows another pressure sensor device 900 using the waterproof packaging technique described above according to some examples. The device 900 has similar structure as the device 700 except that an opening 913 is positioned on a substrate 912 of the device 900, and a LRAPD 901, as illustrated for example in FIGS. 2-8, is disposed at the opening 913. Accordingly, air pressure is exposed to a pressure sensor 920 through the LRAPD 901 in the substrate 912. This design can further inhibit the entry of liquid into the chamber by being on an underside of the pressure sensor device 900.

Figure 10:
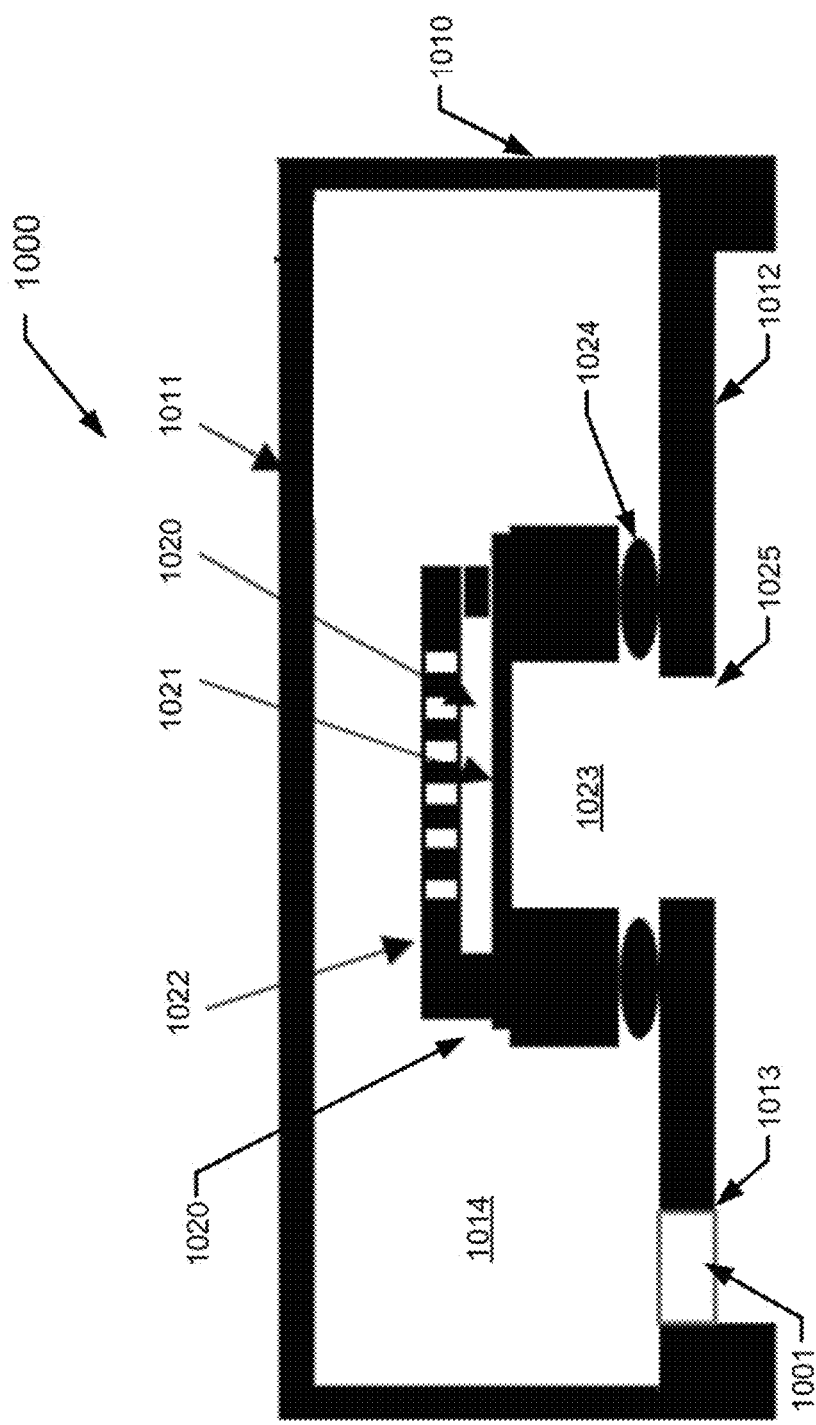
FIG. 10 shows a further pressure sensor device using the waterproof packaging technique described herein according to some examples.

FIG. 10 shows a further pressure sensor device 1000 using the waterproof packaging technique described herein according to some examples. The device 1000 includes a housing 1010 formed by a cover 1011 and a substrate 1012, and a pressure sensor 1020 enclosed in the housing 1010. A chamber 1014 is formed between the cover 1011 and the pressure sensor 1020. In addition, the substrate 1012 includes a first opening 1013, a second opening 1025, and a LRAPD 1001 disposed at the first opening 1013.

In one example, the pressure sensor 1020 is a piezoresistive pressure sensor 1020. In another example, the pressure sensor 1020 is a capacitive pressure sensor 1020. FIG. 10 shows a structure of the capacitive sensor 1020 that is used as an example to illustrate the waterproof packaging technique. As shown, the capacitive sensor 1020 includes a diaphragm 1021 and a perforated back plate 1022. Two metal layers (not shown) each attached to the diaphragm 1021 or the back plate 1022 form two electrodes of a capacitor for sensing operation. A cavity 1023 is formed below the diaphragm 1021, while the back plate 1022 is positioned above the diaphragm 1021. In addition, the second opening 1025 in the substrate 1012 connects the cavity 1023 to the ambient atmosphere. In one example, at least part of the sensing surface (bottom surface in FIG. 10) of the diaphragm 1021 and at least part of the surface of the sidewalk surrounding the cavity 1023 are coated with a SAM coating.

In some examples, the capacitive sensor 1020 performs gage pressure measurement. Accordingly, the chamber 1014 is exposed to the atmosphere pressure through the LRAPD 1001 such that back side (upper side in FIG. 10) of the diaphragm 1021 is exposed to the atmosphere pressure. The sensing surface (lower side in FIG. 10) of the diaphragm 1021 is directly exposed to the atmosphere pressure through the second opening 1025.

Figure 11:
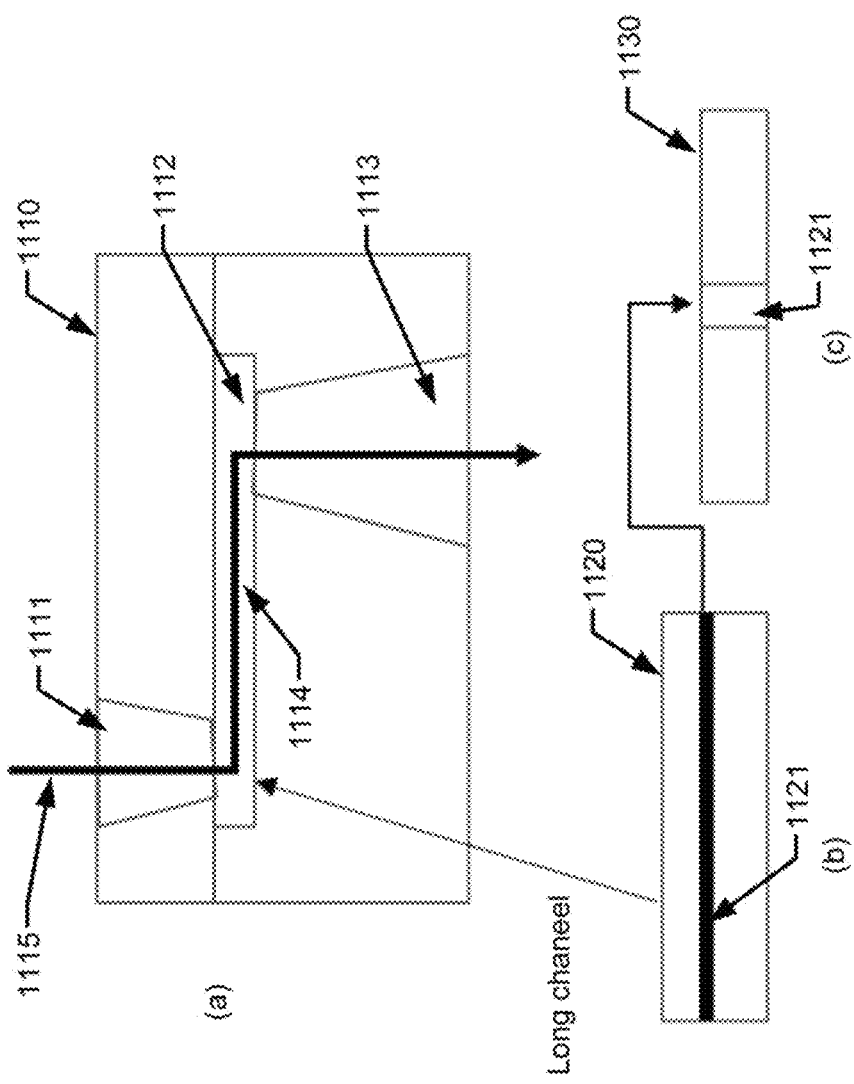
FIG. 11 shows structures of an example LRAPD.

In one example, the pressure sensor 1020 is an acoustic pressure sensor 1020 performing gage pressure measurement, and the device 1000 is configured to be a microphone, for example, used in a mobile device. Accordingly, sound wave pressure passing through the second opening 1025 is sensed by the diaphragm 1021, while atmosphere pressure is vented to the chamber 1014 through the first opening 1013. Because there is no need to allow sound waves to enter the chamber 1014, the LRAPD 1001 proximate to the first opening 1013 can have a single channel with a small cross section area and a long length. FIG. 11 shows structures of an example of the LRAPD 1001 in several diagrams (a) to (c).

Diagram (a) shows a cross sectional view of a LRAPD 1110 including an inlet 1111, a channel 1112, and an outlet 1113 which form a channel 1114. The channel 1114 provides a path for sound waves to pass through. Diagrams (b) and (c) shows a top view 1120 and a sectional view 1130 of the channel 1114, respectively. As shown, the channel 1114 includes a single channel 1121 which can be long such that sound waves may be prevented from entering the chamber 1014 while atmospheric pressure is vented into the chamber 1014.

FIG. 12 shows another pressure sensor device 1200 using the waterproof packaging technique described above according to some examples. The device 1200 has similar structures as the device 1000 in FIG. 10. However, the device 1200 includes another LRAPD 1202 in addition to a LRAPD 1201. Specifically, the device 1200 includes a housing 1210 enclosing a pressure sensor 1220. A cavity 1223 is formed below a diaphragm 1221 of the pressure sensor 1220, and an opening 1225 connects the cavity 1223 to the ambient environment. The LRAPD 1201 vents a chamber 1214 between the housing 1210 and the pressure sensor 1220 to ambient atmosphere. The LRAPD 1202 is disposed over the opening 1225 to prevent water droplets from entering the cavity 1223 while allowing air going into the cavity 1214.

In one example, the device 1200 is configured to be a microphone and the pressure sensor 1220 is an acoustic pressure sensor for sensing sound waves. In order to expose the sensing surface of the diaphragm 1221 to sound waves without damping or distorting the sound waves, the LRAPD 1202 can have a structure similar to that in FIG. 5 where multiple channels 501 are provided for exposing the sound waves to the diaphragm 1221.

The pressure sensor devices described above can be applied to various applications, such as sound pressure sensing, barometric pressure measurement, manifold pressure sensing, and the like. However, it is noted that the water proof packaging techniques and the LRAPDs described above are not limited to pressure sensor devices or pressure sensor applications, and can be used for other devices and applications wherever ambient atmosphere is to be exposed to interior of the devices while liquid droplets are prevented from entering the interior of the devices.

Generally, an omnidirectional microphone is able to pick up sound from all directions, and may be unsuitable for certain applications where the environment as very noisy. For example, when a driver sitting inside a vehicle speaks towards a hands-free mobile phone, an omnidirectional microphone in the mobile phone not only picks up his voice but also picks up all background sounds inside the vehicle thus reducing clarity of driver's voice at the other end of the line. For these applications, a cost effective directional microphone can be employed to mitigate effects of background noise.

Directional microphones can be based on different techniques. For example, one approach is to electronically cancel out the background noise. However, such type of devices requires at least two sound pressure sensors to realize the noise cancellation function, which enlarges device package footprint and increases cost due to an extra sensor element. In addition, auxiliary electronics performing electronic cancellation also do not effectively handle rapidly alternating environmental sound waves.

Aspects of the disclosure provide a packaging technique for making a directional microphone device. The packaging technique employs a certain mechanical structure to cancel environmental noise in contrast to electronic noise cancellation method. The packaging technique does not require an extra sensor or electronic chip to realize directional functions and serves the purpose of a cost effective directional microphone.

A microphone is a sensing device which includes a sound pressure sensor for measuring changes of sound pressure propagating in the air or other types of media. In some applications, the sound pressure is small in terms of pressure scale and therefore a sound pressure sensor is categorized as an ultra-low pressure sensor. A sound pressure sensor can be based on various transduction mechanisms, such as capacitive sensing, piezoresistive sensing, and the like, and can be fabricated with various technologies, such as MEMS technology or non-MEMS technology.

Figure 13A:
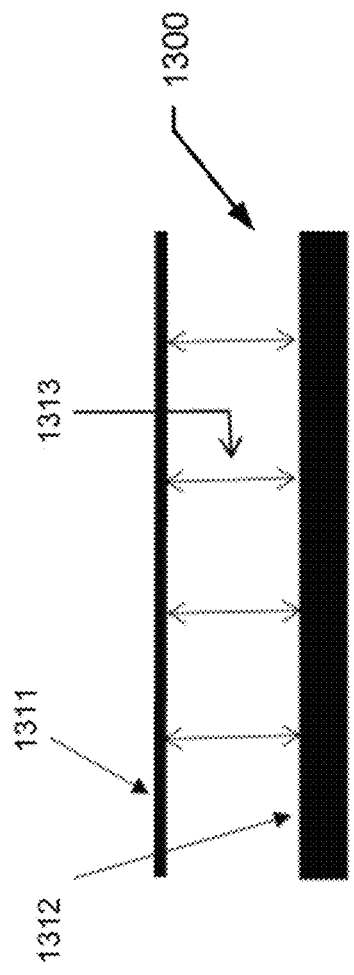
FIG. 13A shows an example of a sound pressure sensor based on capacitive sensing in a first operating state.
Figure 13B:
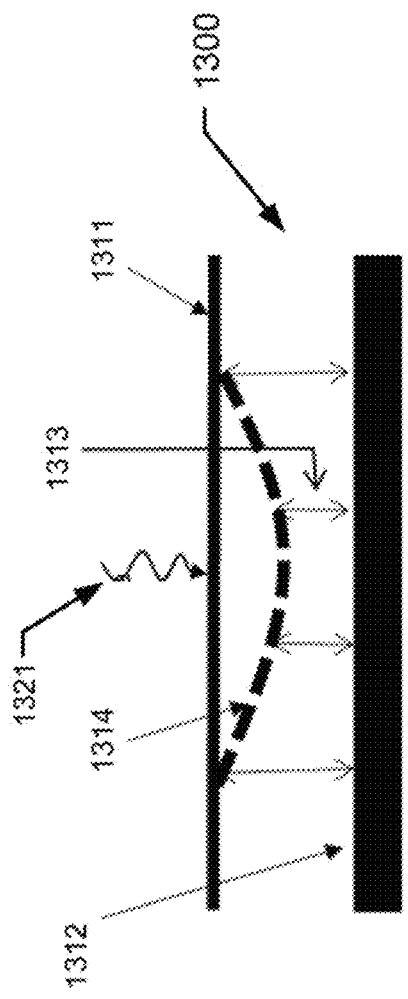
FIG. 13B shows an example of a sound pressure sensor based on capacitive sensing in a second operating state.

FIGS. 13A and 13B show an example of a sound pressure sensor 1300 based on capacitive sensing. The capacitive sensor 1300 includes two electrodes (not shown) each attached to a diaphragm (a moving plate) 1311 and aback plate (a fixed plate) 1312 with a small gap 1313 between both electrodes, thus forming a capacitor. In FIG. 13A, no sound pressure is exerted on the diaphragm 1311, and the two plates 1311/1312 of the sensor 1300 are parallel to each other. In FIG. 13B, a varying sound pressure 1321 is exerted on the diaphragm 1311 and the diaphragm 1311 moves accordingly towards or away from the fixed plate 1312, thus causing deflections 1314 of the diaphragm 1311 and changing capacitance value of the capacitor. Changes of the capacitance value can be indicated, for example, by an output current of a circuit connected with the capacitor. In this way, sound pressure variations can be measured using the capacitive sensor 1300.

Figure 14:
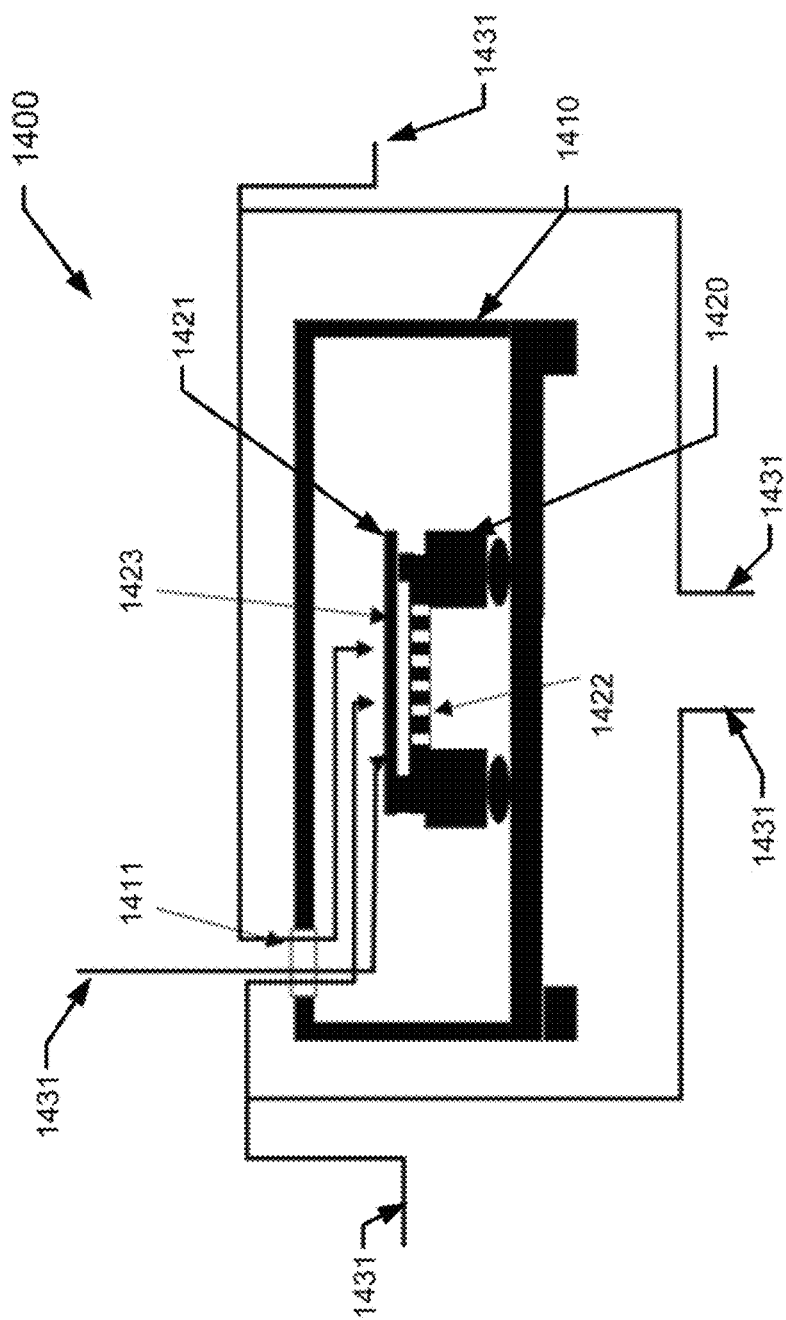
FIG. 14 shows an example of an omnidirectional microphone device.

FIG. 14 shows an example of an omnidirectional microphone device 1400. The microphone device 1400 includes a sound, pressure sensor 1420, and a housing 1410 enclosing the pressure sensor 1420. The housing 1410 includes an opening 1411 for allowing sound waves entering the housing 1410 and reaching a sensing surface 1423 of the sound pressure sensor 1420. In one example, the sound pressure sensor 1420 is a capacitive sensor 1420 which includes a diaphragm 1421 and a perforated back plate 1422. As shown, as the microphone device 1400 is omnidirectional, microphone 1400 picks up sounds 1431 entering the opening 1411 from all directions including background noise, which reduces the clarity of a speaker's voices.

FIGS. 15A and 15B shows how sound pressures of two synchronized sound waves are cancelled at a capacitive pressure sensor 1500. The capacitive pressure sensor 1500 includes a diaphragm 1511, and a fixed plate 1512 with a gap 1513 between the diaphragm 1511 and the fixed plate 1522, thus forming a capacitor. In FIG. 15A, when sound pressures 1521 are exerted on one side (upper side) of the diaphragm 1511, the diaphragm 1511 deflects to deflecting positions 1514 accordingly. In FIG. 15B, however, when a pair of synchronized sound pressures 1521/1522 approaches both sides of the diaphragm 1511 simultaneously, the pressures 1521/1522 exerted on both sides cancel each other out. Accordingly, the diaphragm 1511 does not move. The pair of synchronized sound pressures 1521/1522 can be generated by two synchronized sound waves each exerting a varying sound pressure 1521 or 1522 on opposite side of the diaphragm 1511 while keeping the two varying sound pressures 1521/1522 equal to each other.

Figure 16:
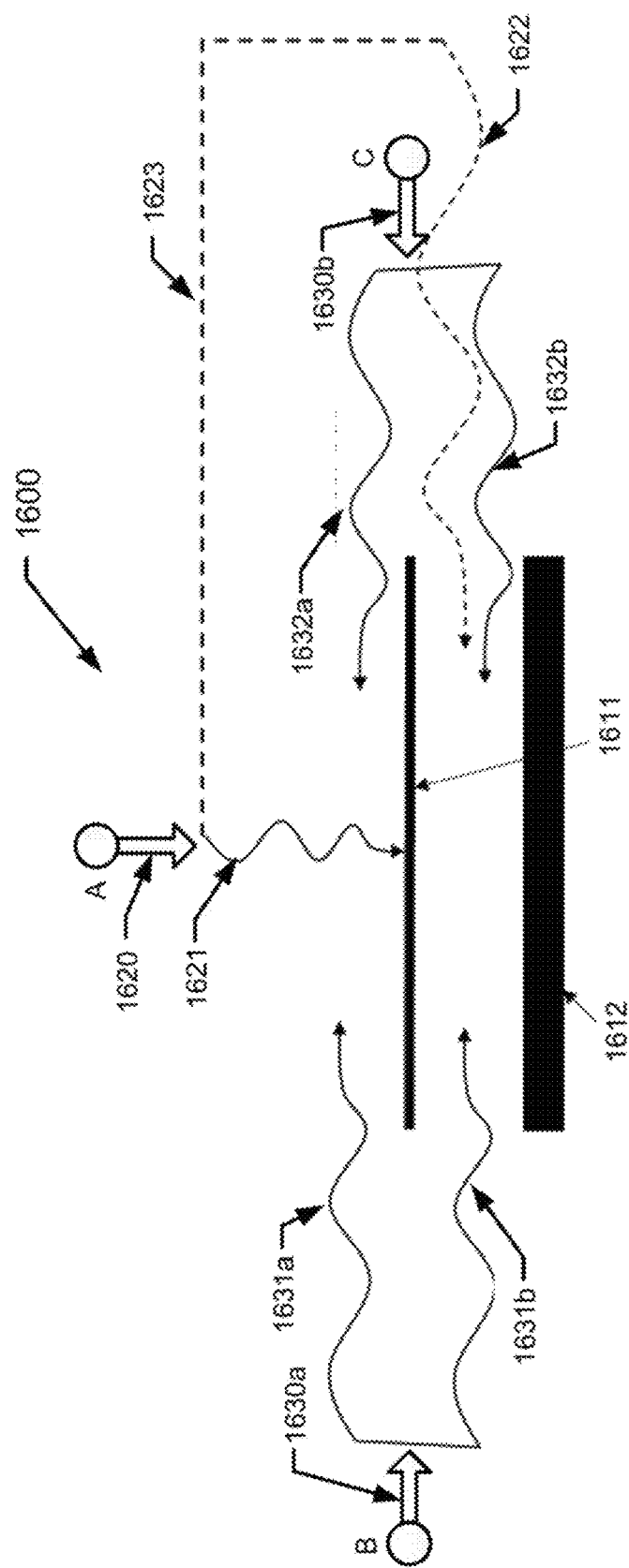
FIG. 16 shows an example capacitive, pressure sensor for illustrating a principle for making a directional microphone.

FIG. 16 shows an example capacitive pressure sensor 1600 for illustrating a principle for making a directional microphone. The capacitive pressure sensor 1600 includes a diaphragm 1611 and a fixed plate 1612 which forms a capacitor, and the diaphragm 1611 moves as a response to a sound pressure exerted on the diaphragm 1611 causing capacitance variation of the capacitor. Changing of the capacitance varying output current or voltage signal indicating variations of the sound pressure.

As shown, a sound wave 1620 is generated from a sound source A. A sound wave 1621, which is a portion of the sound wave 1620, approaches an upper side of the diaphragm 1611 from the direction perpendicular to the diaphragm 1611. The sound wave 1621 exerts, a pressure on the upper side of the diaphragm 1611. Another sound wave 1622, which is another portion of the sound wave 1620, propagates along a route 1623 and approaches a lower side of the diaphragm 1611. Due to a delay caused by passing along the route 1623, the sound waves 1621 and 1622 are not synchronized when reaching opposite sides of the diaphragm 1611. Accordingly, sound pressures of the two sound waves 1621 and 1622 exerted on opposite sides of the diaphragm 1611 will not cancel each other, and the sound pressure of the sound wave 1621 can thus be detected.

As shown, a sound wave 1630a is generated from a sound source B, and two sound waves 1631a/1631b, each of which is a portion of the sound wave 1630, approaches opposite sides of the diaphragm 1611. As the two sound waves 1631a/1631b are generated from the same source B, and reaches opposite sides of the diaphragm 1611 at the same time via paths having the same length, the two sound waves 1631a/1631b synchronizes with each other and will cancel each other. As a result, pressures imposed on the two opposite sides of the diaphragm 1611 by the sound waves 1631a/1631b will not contribute to deflections of the diaphragm 1611. Similarly, sound waves 1632a/1632b, which are portions of a sound wave 1630a generated from a third sound source C, will not be reflected in the varying output signal.

As a result, the sound wave 1621 from the perpendicular direction deflects the diaphragm 1611 and can be sensed by the capacitive pressure sensor 1600 while sound waves from other directions, such as the sound waves 1630a/1630b, will not be sensed due to the cancellation effect. When a microphone is configured in a way showed in FIG. 16 that sound waves are allowed to approach a sensing surface from a direction perpendicular to the sensing surface, or approach opposite sides of the sensing surface via two equal-length routes from other directions, the microphone can have a directional sensing ability which picks up sound from the perpendicular direction while canceling sound from other directions.

The principle illustrated in FIG. 16 can be employed to create a directional microphone. Accordingly, a packaging technique based on the principle is described herein to make a cost effective unidirectional microphone. The packaging technique is illustrated with examples shown in FIGS. 17-21. The examples in FIGS. 17-21 are based on MEMS technologies, but the packaging technique is not exclusive to MEMS microphone and it can also be used with other types of microphone fabricated with non-MEMS technologies.

It is also noted that although capacitive pressure sensors are used as examples for illustrating the principle and the packaging technique for making a directional microphone in FIGS. 16-21, the principle and the packaging technique are not limited to capacitive pressures sensors. Any sensors based on other transduction mechanisms with a sensing diaphragm capable of receiving a sound wave at both sides can be used for making directional microphones based on the principle and packaging technique described herein. For example, a directional microphone can be made of a piezoresistive pressure sensor.

FIG. 17 shows a sectional view of: in example unidirectional microphone device 1700 according to some examples. The device 1700 includes a cover 1712 and a first substrate 1730 which form a housing 1724 enclosing an acoustic pressure sensor 1716. A chamber 1746 is formed between the cover 1724 and the acoustic pressure sensor 1716. In one example, the first substrate 1730 is a part of the acoustic pressure sensor 1716. For example, the first substrate 1730 is a portion of a silicon wafer which is used for fabricating one or more parts of the acoustic pressure sensor 1716, and the cover 1712 is later bonded and sealed to the first substrate 1730 to form the housing 1724. In another example, the acoustic pressure sensor 1716 is fabricated on a silicon die that is bonded to the first substrate 1730 that is a part of a packaging housing, and the cover 1712 is then sealed to the packaging substrate 1730 to form the housing 1724. In the above two examples, the cover 1712 or the package housing 1724 can be made of any suitable materials, such as plastics, metals, ceramics, glass, and the like. In some examples, the first substrate 1730 can include one or more electrical contacts 1702 for establishing connections, for example, with a printed circuit board (PCB).

The acoustic pressure sensor 1716 can be a capacitive pressure sensor, a piezoresistive sensor, and the like, and can be a sensor based on MEMS technology or non-MEMS technology. In one example, the acoustic pressure sensor 1716 includes a sensing diaphragm 1722 which can move as a response to a sound pressure exerted on the sensing diaphragm 1722. The acoustic pressure sensor 1716 may further include a fixed plate in other examples, such as the capacitive sensors in FIGS. 7, 9, 10 and 12, although not shown in FIG. 17, for performing capacitive sensing.

In one example, the acoustic pressure sensor 1716 further includes a cavity 1736 below the sensing diaphragm 1722. For example, in the FIG. 17 example, the acoustic pressure sensor 1716 includes one or more sidewalk 1732 below the sensing diaphragm 1722 that support the sensing diaphragm 1722 at the edge of the sensing diaphragm 1722, and enclosing the cavity 1736 below the sensing diaphragm 1722. In addition, lower edges of the sidewalk 1732 are attached to a second substrate 1726 which includes an opening 1738 connected to the cavity 1736. Then, the second substrate 1726 is attached to the first substrate 1730. Thus, the sensing diaphragm 1722, the sidewalk 1732, the second substrate 1726, and the first substrate 1730 enclose the cavity 1736.

It is to be appreciated that in various designs, the cavity 1736 can be formed with various structures. For example, the acoustic pressure sensor 1716 may not include structure of the sidewalls 1732 and the sensing diaphragm 1722 may be disposed directly over the opening 1738 of the second substrate 1726. For another example, the second substrate 1726 may not include an opening 1738, thus enclosing the cavity 1736 from below. For a further example, the second and third substrate 1726 and 1730 may be one substrate, for example, fabricated from one silicon wafer.

In one example, the acoustic pressure sensor 1716 includes the second substrate 1726. The second substrate 1726 includes one or more channels 1734a/1734b connecting the cavity 1736 with exterior of the acoustic pressure sensor 1716. In one example, an outlet at one end of each channel is connected with the cavity 1736 and at outlet at the other end of each channel is opened at the edge of the second substrate 1726 as shown in FIG. 17. Each of the one or more channels 1734a/1734b provides a path for sound waves to reach the cavity, and subsequently the lower side of the sensing diaphragm 1722, from exterior of the acoustic sensor 1716.

It is noted that although only two channels 1734a/1734b are shown in FIG. 17, there can be more than two channels crossing the second substrate 726, for example, 6, 8, 20, and any other suitable numbers of channels. In addition, in one example, the multiple channels can be evenly distributed and extend from the cavity 1736 or the opening 1738 to the edge of the second substrate 1726.

In one example, the acoustic pressure sensor 1716 further includes an auxiliary integrated circuit 1714. The auxiliary integrated circuit 1714 can be used for conditioning or controlling operations of the acoustic pressure sensor 1716, or the auxiliary integrated circuit 1714 can include circuitry, such as a pre-amplifier, for processing a signal generated at the acoustic pressure sensor 1716.

As shown in FIG. 17, the cover 712 can include two types of openings for allowing sound pressures entering the housing 1724 and reaching the sensing diaphragm 1722. A first opening 1720 is positioned above the sensing diaphragm 1722 such that sound waves from the first opening 1720 reach the sensing diaphragm 1722 from above the sensing diaphragm 1722. One or more second openings 1708a/1708b are positioned at the edge of the cover 1712 where the cover 1712 is bonded to the first substrate 1730 in one example. In addition, in one example, second openings 1708a/1708b are positioned adjacent to entrances 1735a/1735b of channels 1734a/1734b. For example, the second opening 1708a is adjacent to the entrance 1735a of the channel 1734a, while the second opening 1708b is adjacent to the entrance 1735b of the channel 1734b. Accordingly, when sound waves enter the housing 1724 from a second openings 1708a/1708b, the sound waves can have two separate paths to reach opposite sides of the sensing diaphragm 1722: one path is through a channel 1734a/1734b to reach the lower side of the sensing diaphragm 1722, and another path is through the chamber 1746 to reach the upper side of the sensing diaphragm 1722.

In operation, the device 1700 can pick up a sound 1718 entering the first opening 1720 while a sound 1728 entering second openings 1708a/1708b is being cancelled. Specifically, as an example shown in FIG. 17, a first portion of the sound 1718 entering the first opening 1720 approaches the upper side of the sensing diaphragm 1722 from a direction perpendicular to the sensing diaphragm 1722. At the same time, a second portion of the sound 1718 entering the first opening 1720 propagates along the route 1710 and reaches the lower side of the sensing diaphragm 1722. The route 1710 passes the channel 1734a as illustrated in FIG. 17. The second portion of the sound 1718 is delayed due to the long sound travel route 1710. Accordingly, the first and second portion of the sound 1718 are not synchronized and do not cancel each other out. Thus, the sound 1718 can be detected by the sensor.

In contrast, the sound 1728 entering the second opening 1708b can include a first portion and a second portion which reach the upper side and lower side of the sensing diaphragm 1722 via two different routes 1744/1742 as shown in FIG. 17. The path 1744 is between the cover 1712 and the acoustic sensor 1716, and the path 1742 is via the channel 1734b through the second substrate 1726. As shown, the two different routes 1744/1742 can have approximately the same distance, and no delay or small delay is introduced between the first and second portion of the sound 1728. Accordingly, the first and second portion of the sound 1728 will cancel each other out, and thus the sound 1728 cannot be detected by the sensor.

In one example, the first substrate 1730 includes a first barrier wall structure 1704 and second barrier wall structure 1706 for blocking sound waves inside the housing 1724 from leaving the housing. As a result, interferences caused by sound waves leaving the housing 1724 and subsequently reentering the housing 1724 can be avoided. As shown, in one example, the barrier wall structures 1704/1706 is disposed proximate the second openings 1708a/1708b such that sound waves from inside the housing 1724 will be reflected back to the housing 1724. It also reduces sounds from various angles from entering the housing 1724.

It is noted that, in order to cancel pressures generated by sound waves entering the housing 1724 through a second opening 1708a in the cover 1712, a length of a channel 1734a can be determined in such a way that the length of the channel 1734a is equal to or approximately equal to a length of a route from the second opening 1708a to the upper side of the sensing diaphragm 1722. Under such a configuration, two portions of a sound wave entering the second opening 1708a will reach the upper side and lower side of the sensing diaphragm 1722, respectively, at a same time thus being synchronized to each other. As a result, sound pressures of the two portions are cancelled by each other.

FIG. 18 shows a sectional view of an example substrate structure 1800. The substrate structure 1800 corresponds to a combination of the first substrate 1726 and the second substrate 1730 shown in FIG. 17. As shown, the substrate structure 1800 includes a first substrate 1810 and a second substrate 1820 corresponding to the first substrate 1726 and the second substrate 1730 shown in FIG. 17. The second substrate 1820 can include an opening 1821 connected with the cavity 1736 in FIG. 17. The second substrate 1820 can further include two channels 1822a and 1822b extending from the edge of the second substrate 1820 to the opening 1821, thus each providing a path 1823a or 1823b for sound waves reaching the opening 1821.

In addition, the first and second substrate 1810 and 1820 can be bonded together, for example, by some adhesive materials 1841. In one example, a gap 1840 is formed between the two substrates 1810 and 1820. However, in another example, no gap exists between the two substrates 1810 and 1820. In various examples, the first substrate 1810 can be a print circuit board (PCB), a part of a packing housing, a silicon chip, and the like, and the second substrate 1820 can be a silicon die, or a chip made of suitable materials.

FIG. 19 shows a perspective view of an example unidirectional microphone device 1900. As shown, a sound pressure sensor 1901 is packaged within a housing 1910. The housing 1910 includes a cover 1912 attached to a substrate 1914. A first opening 1916 is positioned over the sensor 1901 at the top of the cover 1912. In one example, the position of the first opening 1916 is close to one side of the microphone and away front the middle of the cover 1912. In addition, multiple second openings 1918 are positioned along the edge of the cover 1912 where the cover 1912 and the substrate 1814 adjoin to each other. In operation, sounds entering the first opening 1916 can be picked up by the sensor 1901, while sounds entering the second openings 1918 will not be sensed by the sensor 1901 due to the cancellation effect discussed previously.

Figure 20A:
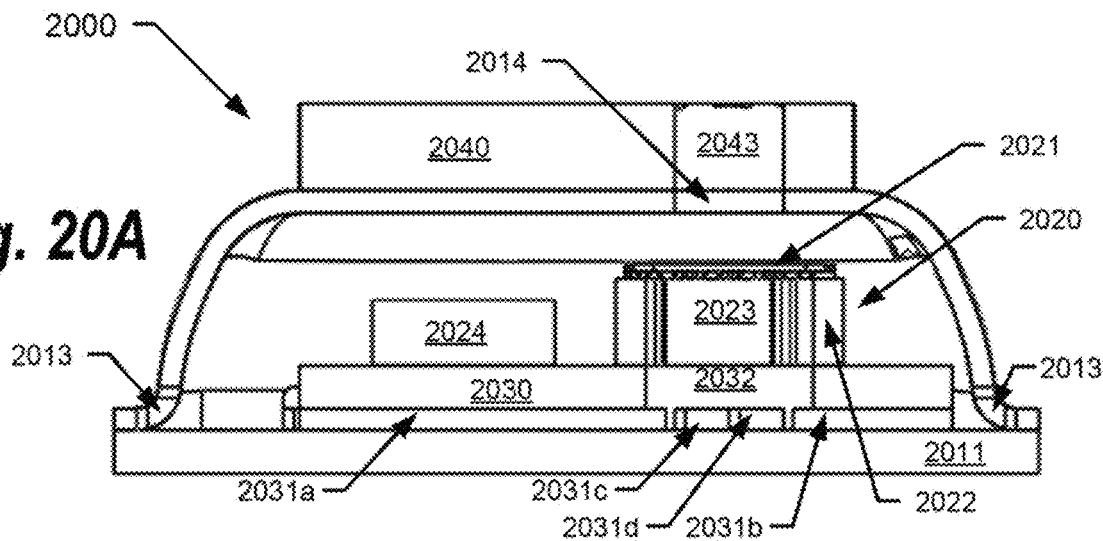
FIG. 20A shows an example of a unidirectional microphone device in a sectional view.
Figure 20B:
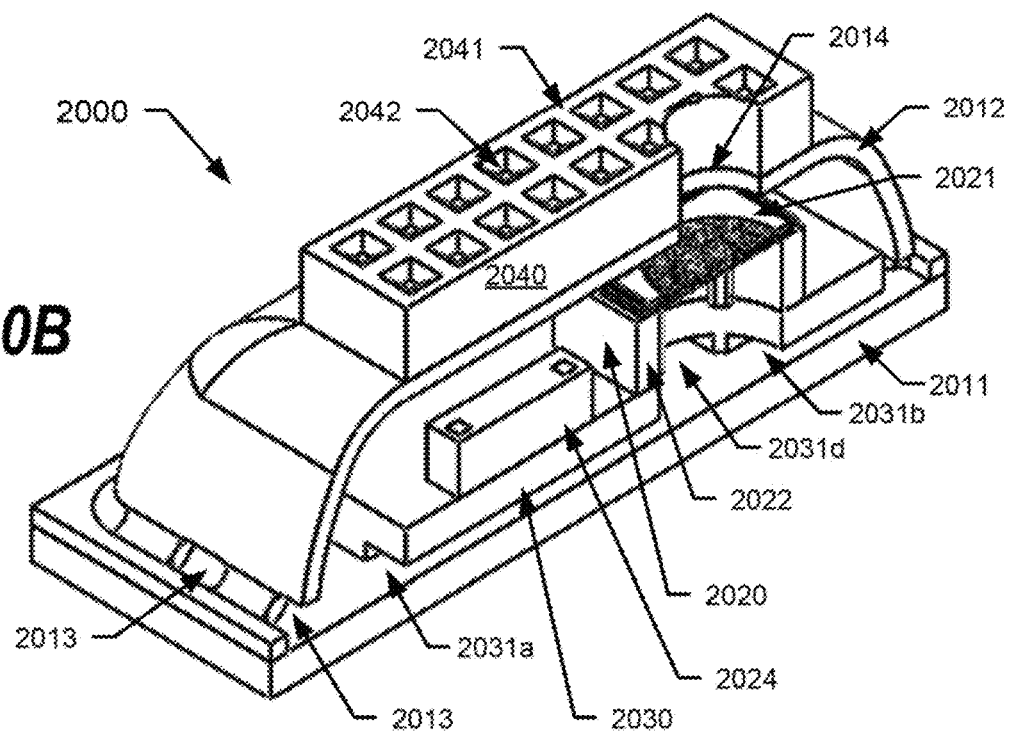
FIG. 20B shows an example of a unidirectional microphone device in a perspective sectional view.
Figure 20C:
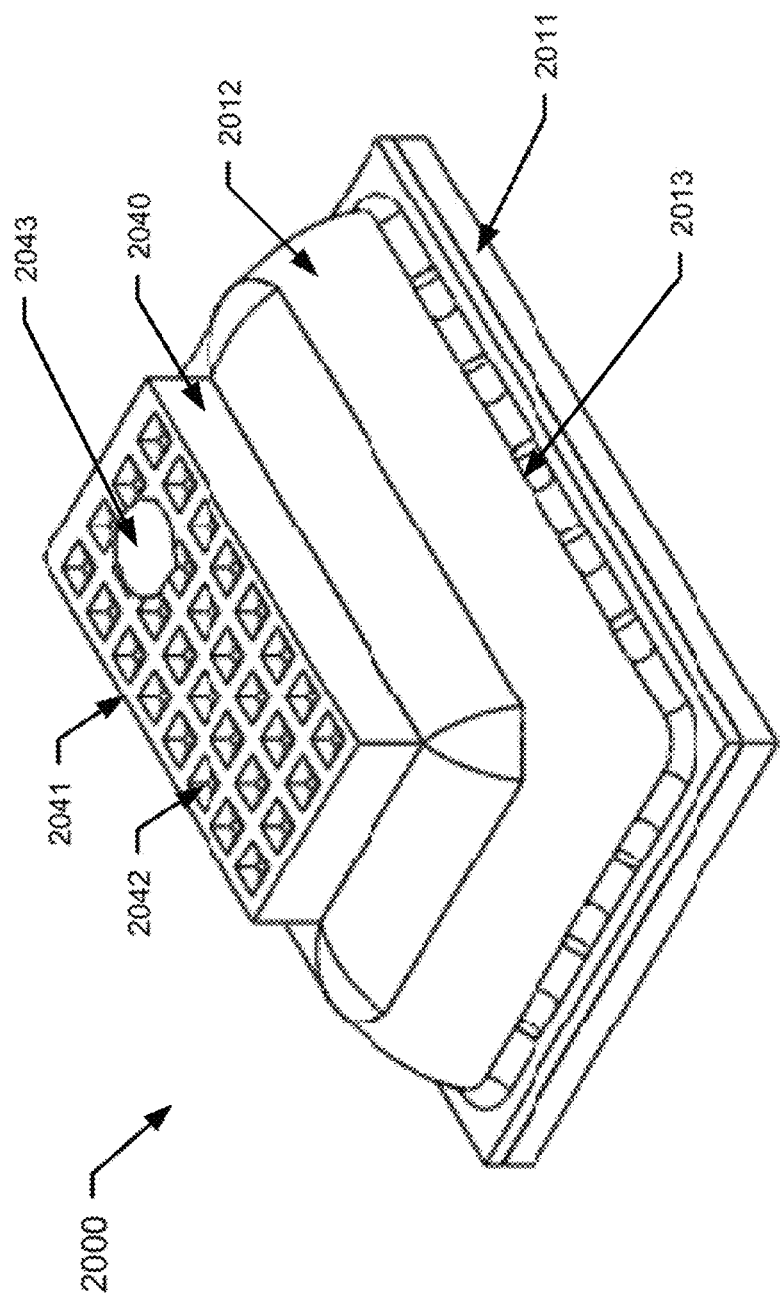
FIG. 20C shows an example of a unidirectional microphone device in a perspective view.

FIGS. 20A/20B/20C show an example of a unidirectional microphone device 2000 in sectional view, perspective sectional view, and perspective view, respectively. An anechoic chip 2040 is mounted on top of a cover 2012 of the device 2000 in order to reduce interference to a sensing operation of the device 2000.

The device 2000 includes a first substrate 2011 the cover 2012 which encloses an acoustic pressure sensor 2020. The sensor 2020 includes a sensing diaphragm 2021, a cavity 2023 below the sensing diaphragm 2021 surrounded be sidewalls 2022. The sensor 2020 also includes a second substrate 2030, and auxiliary electronics 2024. The second substrate 2030 includes an opening 2032 below the cavity 2023. The second substrate 2030 further includes multiple channels 2031a-2031d, each of which has an inlet at the outer edge of the second substrate 2030 and an outlet connected with the cavity 2023 below the sensing diaphragm 2021.

In addition, the device 2000 includes a first opening 2014 in the cover 2012 above the sensing diaphragm 2021, and multiple second openings 2013 at the edge of the cover 2012 where the cover 2012 adjoins to the first substrate 2011.

As shown, the anechoic chip 2040 is mounted on top of the cover 2012, and includes an opening 2043 over the opening 2014 in the cover 2012. In one example, the anechoic chip 2040 is coated with a porous layer 2041 for deadening sound. The porous layer 2041 can include minute cavities or holes 2042 on its surface for trapping incoming sound. The structure of the minute spaces or holes can be various in various examples. For example, the minute cavities 2042 can be formed by rectangular studs densely arranged in orthogonal directions, densely arranged cones, or combination of different structures.

It is noted that mounting anechoic chips is optional when packaging a unidirectional microphone. In addition, an anechoic chip can be mounted beneath the surface of top side of a cover where the top surface has an opening to hold and expose the anechoic chip.

Figure 21:
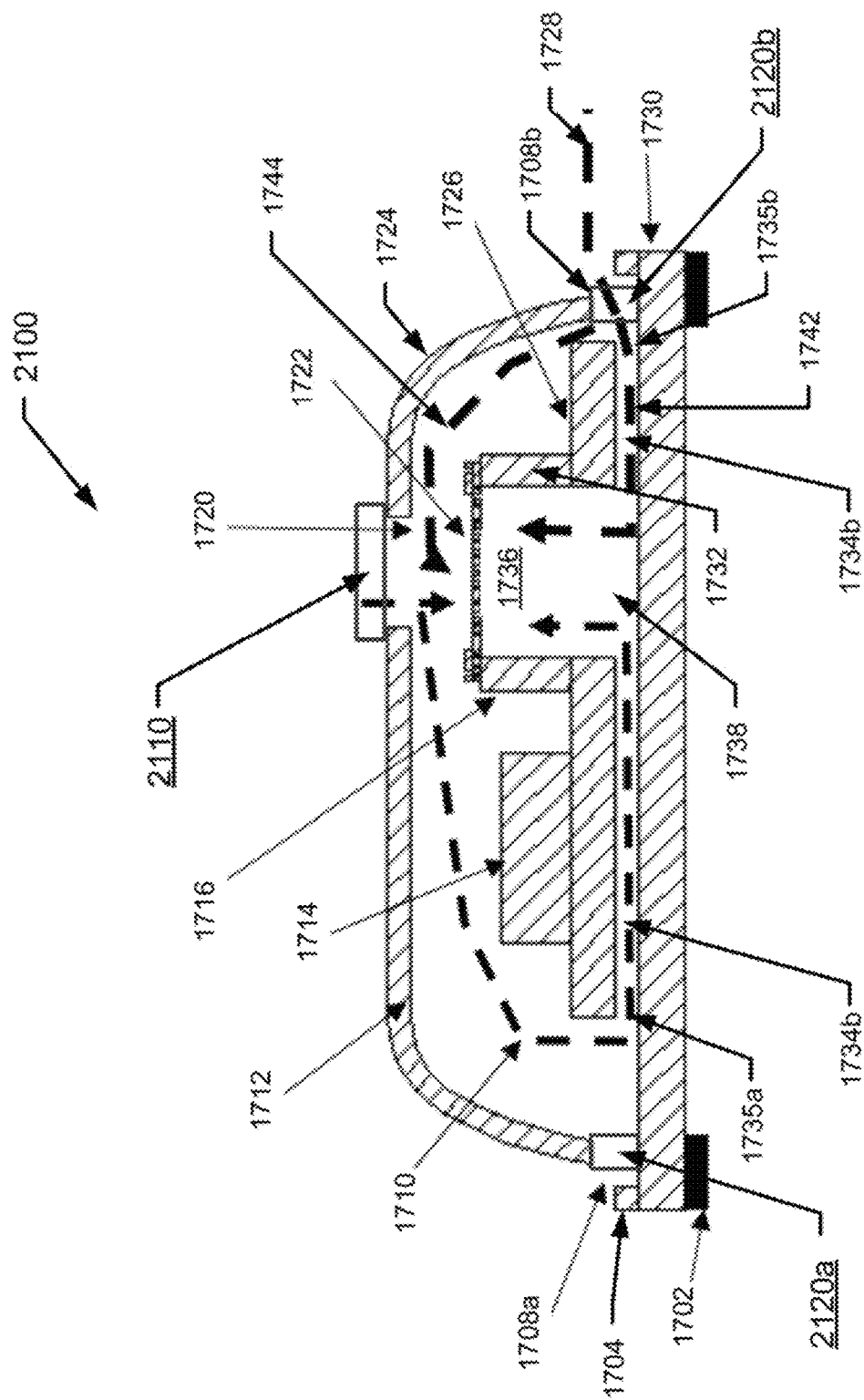
FIG. 21 shows an example directional microphone device with LRAPDs according to some examples.

FIG. 21 shows an example directional microphone device 2100 with LRAPDs according to some examples. The device 2100 has similar structure as the device 1700 in FIG. 17. However, multiple LRAPDs are employed to protect the sensor 1716 from water droplet damaging. Specifically, a LRAPD 2110 is disposed proximate to the first opening 1720, while multiple LRAPDs 2120a/2120b are disposed proximate to the second openings 1708a/1708b. In one example, these LRAPDs 2110/2120a/2120b are configured to allow sound pressures to reach the sensing diaphragm without dampening the corresponding sound waves. Thus, short and broad channels may be employed in these LRAPDs 2110/2120a/2120b.

As describes, aspects of the disclosure provide a waterproof packaging technique which can be used for fabricating waterproof microphones in mobile devices. The waterproof packaging technique employs a liquid-resistant air inlet passive device (LRAPD) which can include a liquid-repellant channel and can be attached to an opening in a housing enclosing an acoustic pressure sensor. In one example, the inner surface of the LRAPD is coated with a self-assembled monolayer (SAM) to realize the waterproof function.

A device based on the waterproof packaging technique can include a microelectromechanical system (MEMS) device, a housing enclosing the MEMS device, and a liquid-resistant air inlet passive device (LRAPD) on the housing. The LRAPD can include at least one channel connecting an exterior of the housing with a chamber formed between the housing and the MEMS device. An inside surface of the channel can be coated with a liquid repellant coating. In some examples, the liquid-repellant coating can be a self-assembled monolayer (SAM) coating. The LRAPD can be attached to an inner side of the housing with an inlet of the channel connected to an opening in the housing, or attached to an outer side of the housing with an outlet of the channel connected to an opening in the housing. Alternatively, the LRAPD can be disposed in an opening of the housing.

In one example, the LRAPD includes multiple channels connecting an exterior of the housing with the chamber, and surfaces of the multiple channels are coated with a liquid-repellant coating. In some examples, the housing can include a cover over a substrate supporting the MEMS device, and the LRAPD can be disposed on the substrate.

The MEMS device can be a pressure sensor, such as a piezoresistive pressure sensor, a capacitive pressure sensor, and the like in various examples. In one example, the MEMS device is an acoustic pressure sensor with a sensing surface facing the chamber for sensing an acoustic wave, and the LRAPD is formed in a direction of the sensing surface to allow the acoustic wave to reach the sensing surface without dampening the acoustic wave. In another example, a surface of a diaphragm opposite the sensing surface faces the chamber, and the LRAPD is configured to provide an air pressure in the chamber that is equal to atmospheric pressure. Accordingly, in one example, the LRAPD includes a zigzag channel.

In a further example, the acoustic pressure sensor includes a cavity between the sensing surface and a housing with an opening in the housing connecting the cavity with the exterior of the housing, and the LRAPD covers the opening.

In one example, the LRAPD includes a zigzag channel. In another example, the LRAPD includes a cavity proximate the channel to collect liquid. In a further example, the MEMS device is an acoustic pressure sensor with a sensing surface facing the chamber, and the channel of the LRAPD includes a portion sloping from one end to the other end with respect to the sensing surface to allow an acoustic wave to reach the sensing surface. In one example, the MEMS device is an acoustic pressure sensor with a sensing surface facing the chamber, and the channel of the LRAPD includes a longest portion running parallel from a first end to a second end with respect to the sensing surface to allow an acoustic wave to reach the sensing surface.

As described, aspects of the disclosure provide another packaging technique for making a directional microphone. The packaging technique employs mechanical structures to cancel undesired background noise to realize directional picking up functions instead of requiring an extra sensor in electronic noise-cancelling techniques. Accordingly, the packaging technique enables a directional microphone with reduced a footprint and cost.

A directional microphone device based on the packaging technique can include an acoustic sensor and a housing enclosing the acoustic sensor. The acoustic sensor can include a sensing diaphragm for sensing sound pressure, a cavity below the sensing diaphragm, and a first substrate. The directional microphone device can further includes a channel with an inlet open at an edge of the first substrate and an outlet connected with the cavity. The housing can include a cover attached to a second substrate supporting the first substrate. The cover can include a first opening over the sensing diaphragm and a second opening at a side of the cover. The second opening can be disposed adjacent to the inlet of the channel.

In some examples, a first distance of a first path from the second opening to the sensing diaphragm via the channel is configured to be equal to a second distance of a second path from the second opening to the sensing diaphragm via a chamber between the cover and the acoustic sensor.

In some examples, the directional microphone device includes multiple channels each having an inlet open at the edge of the first substrate and an outlet connected with the cavity. The multiple channels can extend from the cavity to the edge of the first substrate, and can be evenly distributed from each other. In some examples, the cover includes multiple second openings at sides of the cover. The multiple second openings can be evenly distributed along the edge of the cover. In addition, in some examples, the multiple second openings are positioned adjacent to respective inlets of the multiple channels.

The acoustic sensor can be fabricated with MEMS technology. The acoustic sensor can be a capacitive pressure sensor, or a piezoresistive pressure sensor, and the like. In some examples, the microphone device can include an anechoic chip disposed over the cover and configured to absorb sound waves reaching the anechoic chip.

In one example, the first substrate is bonded to the second substrate. In another example, the channel is formed between the first substrate and the second substrate. In a further example, the first substrate and the second substrate are a same substrate made from a silicon wafer.

In one example, the second substrate further includes a barrier wall disposed outside the housing at an edge of the second substrate and adjacent to the second opening outside the housing. In one example, the barrier wall is configured to block sound waves inside the housing from leaving the housing, and to block sound waves outside the housing from entering the housing.

In one example, the acoustic sensor includes sidewalls attached to the sensing diaphragm and the first substrate to form the cavity. In another example, the first substrate includes an opening below the cavity. In a further example, the sensing diaphragm is attached to the first substrate, and the cavity is positioned within the first substrate.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A device, comprising:
an acoustic sensor having
a first substrate, the first substrate including a first surface;
a sensing diaphragm mounted to the first surface and configured to sense sound pressure; and
a cavity below the sensing diaphragm;
a channel with an inlet open at an edge of the first substrate and an outlet connected with the cavity; and
a housing enclosing the acoustic sensor, the housing having a cover attached to a second substrate supporting the first substrate;
wherein the cover includes a first opening at least partially overlapping with the sensing diaphragm in a direction perpendicular to the first surface, and a second opening at a side of the cover, the second opening being disposed adjacent to the inlet of the channel.

2. The device according to claim 1, further including:
an anechoic chip mounted on top of the cover, the anechoic chip including
a first opening at least partially overlapping with the first opening of the cover; and
a plurality of cavities disposed around the first opening of the anechoic chip.

3. The device according to claim 2, wherein
the first opening of the anechoic chip has a first diameter that is larger than a second diameter of the plurality of cavities.

4. The device according to claim 1, further comprising
a barrier wall disposed outside the housing at an edge of the second substrate and adjacent to the second opening, the barrier wall being spaced apart from the housing.

5. The device of claim 4, wherein the barrier wall is configured to block sound waves inside the housing from leaving the housing, and to block sound waves outside the housing from entering the housing.

6. The device of claim 1, wherein a first distance of a first path from the second opening to the sensing diaphragm via the channel is configured to be equal to a second distance of a second path from the second opening to the sensing diaphragm via a chamber between the cover and the acoustic sensor.

7. The device of claim 1, further comprising:
multiple channels each having an inlet open at the edge of the first substrate and an outlet connected with the cavity.

8. The device of claim 7, wherein the multiple channels extend from the cavity to the edge of the first substrate.

9. The device of claim 8, wherein the spacing of the multiple channels is evenly distributed.

10. The device of claim 7, wherein the cover includes multiple second openings at sides of the cover.

11. The device of claim 7, wherein a first distance of a first path from each one of the second openings to the sensing diaphragm via a corresponding one of the multiple channels is configured to be equal to a second distance of a second path from the same second opening to the sensing diaphragm via a chamber between the cover and the acoustic sensor.

12. The device of claim 1, wherein the acoustic sensor is fabricated with MEMS technology.

13. The device of claim 1, wherein the acoustic sensor is a capacitive pressure sensor.

14. The device of claim 1, wherein the acoustic sensor is a piezoresistive pressure sensor.

15. The device of claim 1, wherein the first substrate is bonded to the second substrate.

16. The device of claim 1, wherein the channel is formed between the first substrate and the second substrate.

17. The device of claim 1, wherein the first substrate and the second substrate are a same substrate made from a silicon wafer.

18. The device of claim 1, wherein the acoustic sensor includes sidewalls attached to the sensing diaphragm and the first surface of the first substrate to form the cavity.

19. The device of claim 1, wherein the first substrate includes an opening below the cavity.

\* \* \* \* \*